US012620964B2

(12) United States Patent
Ruby et al.

(10) Patent No.: US 12,620,964 B2
(45) Date of Patent: May 5, 2026

(54) ACOUSTIC RESONATOR DEVICE

(71) Applicant: Avago Technologies International Sales Pte. Limited, Singapore (SG)

(72) Inventors: Richard Ruby, Menlo Park, CA (US); Steve Gilbert, San Francisco, CA (US); David Archbold, Pleasanton, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 1171 days.

(21) Appl. No.: 17/522,311

(22) Filed: Nov. 9, 2021

(65) Prior Publication Data

US 2022/0069798 A1     Mar. 3, 2022

Related U.S. Application Data

(63) Continuation of application No. 16/584,451, filed on Sep. 26, 2019, now Pat. No. 11,183,987.

(51) Int. Cl.
H03H 9/13         (2006.01)
H03H 9/02         (2006.01)

(52) U.S. Cl.
CPC ........ H03H 9/132 (2013.01); H03H 9/02543 (2013.01)

(58) Field of Classification Search
CPC .. H03H 9/58; H03H 9/14541; H03H 9/02866; H03H 9/02826; H03H 9/02574; H03H 9/02614; H03H 9/02543; H03H 9/132
See application file for complete search history.

(56) References Cited

U.S. PATENT DOCUMENTS

| | | | |
|---|---|---|---|
| 4,163,201 A | 7/1979 | Takahashi et al. | |
| 5,355,568 A | 10/1994 | Imai et al. | |
| 6,377,138 B1 * | 4/2002 | Takagi ............... | H03H 9/02929 |
| | | | 333/195 |
| 6,516,503 B1 * | 2/2003 | Ikada ................. | H03H 9/14538 |
| | | | 29/25.35 |
| 10,270,421 B2 * | 4/2019 | Kawasaki ............ | H03H 9/6436 |
| 2002/0135442 A1 * | 9/2002 | Sawada ................ | H03H 9/0071 |
| | | | 333/195 |

(Continued)

FOREIGN PATENT DOCUMENTS

| | | |
|---|---|---|
| CN | 109861662 A | 6/2019 |
| DE | 10 2017 111 448 A1 | 2/2022 |

(Continued)

OTHER PUBLICATIONS

German Office Action on DE Appln No. 102020120327.6 dated Aug. 8, 2024.

*Primary Examiner* — J. San Martin
(74) *Attorney, Agent, or Firm* — Foley & Lardner LLP

(57)     ABSTRACT

The present disclosure provides an acoustic resonator device, among other things. One example of the disclosed acoustic resonator device includes a substrate having a carrier layer, a first layer disposed over the carrier layer, and a piezoelectric layer disposed over the first layer. The acoustic resonator device is also disclosed to include an interdigitated metal disposed over the piezoelectric layer, where the interdigitated metal is configured to generate acoustic waves within an acoustically active region. The acoustic resonator device is further disclosed to include an acoustic wave scattering structure.

12 Claims, 18 Drawing Sheets

(56) References Cited

U.S. PATENT DOCUMENTS

| | | | |
|---|---|---|---|
| 2004/0222717 A1 | 11/2004 | Matsuda et al. | |
| 2007/0096180 A1* | 5/2007 | Yamakawa | H10B 53/00 |
| | | | 257/295 |
| 2007/0241841 A1* | 10/2007 | Hauser | H03H 9/6423 |
| | | | 333/193 |
| 2008/0024037 A1 | 1/2008 | Tamura et al. | |
| 2010/0187949 A1 | 7/2010 | Pahl et al. | |
| 2012/0019102 A1* | 1/2012 | Seki | H03H 3/10 |
| | | | 310/313 C |
| 2012/0086312 A1 | 4/2012 | Kobayashi et al. | |
| 2014/0145558 A1 | 5/2014 | Hori et al. | |
| 2017/0272049 A1 | 9/2017 | Kawachi et al. | |
| 2018/0287586 A1* | 10/2018 | Daimon | H03H 9/25 |
| 2019/0036509 A1* | 1/2019 | Tai | H10N 30/086 |
| 2019/0356297 A1 | 11/2019 | Komiyama et al. | |
| 2019/0363697 A1* | 11/2019 | Yamane | H03H 9/706 |
| 2020/0036360 A1* | 1/2020 | Tanaka | H03H 9/64 |
| 2020/0058842 A1 | 2/2020 | Akiyama et al. | |
| 2020/0144981 A1* | 5/2020 | Knapp | H03H 9/02834 |
| 2020/0313650 A1 | 10/2020 | Yamamoto et al. | |
| 2020/0328823 A1* | 10/2020 | Nakagawa | H04B 11/00 |
| 2021/0050841 A1* | 2/2021 | Mimura | H03H 9/145 |
| 2023/0223923 A1* | 7/2023 | Inoue | H03H 9/02228 |
| | | | 310/348 |
| 2024/0333252 A1* | 10/2024 | Lee | H03H 9/25 |

FOREIGN PATENT DOCUMENTS

| | | | |
|---|---|---|---|
| JP | 2001-052579 A | 2/2001 | |
| JP | 2001-053579 A | 2/2001 | |

* cited by examiner

ACOUSTIC RESONATOR DEVICE

CROSS REFERENCE TO PRIORITY APPLICATIONS

The present U.S. Utility Patent application claims priority pursuant to 35 U.S.C. § 120 as a continuation of U.S. Utility application Ser. No. 16/584,451, entitled "AN ACOUSTIC RESONATOR DEVICE", filed Sep. 26, 2019.

FIELD OF THE DISCLOSURE

The present disclosure is generally directed toward acoustic resonator devices.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (e.g., diplexer, triplexer, quadplexer, quintplexer, etc.), connected between an antenna (there could be several antennas like for MIMO) and a transceiver for filtering received and transmitted signals.

Various types of filters use mechanical resonators, such as acoustic wave resonators. Acoustic wave resonators convert electrical signals to mechanical signals or vibrations, and/or mechanical signals or vibrations to electrical signals.

While certain surface modes are desired, certain unwanted modes can exist between the opposing faces of the piezoelectric material of the acoustic wave resonator. These unwanted modes are parasitic, and can impact the performance of filters comprising acoustic wave resonators.

BRIEF DESCRIPTION OF THE DRAWINGS

The present disclosure is described in conjunction with the appended figures.

DETAILED DESCRIPTION

Figure 1:
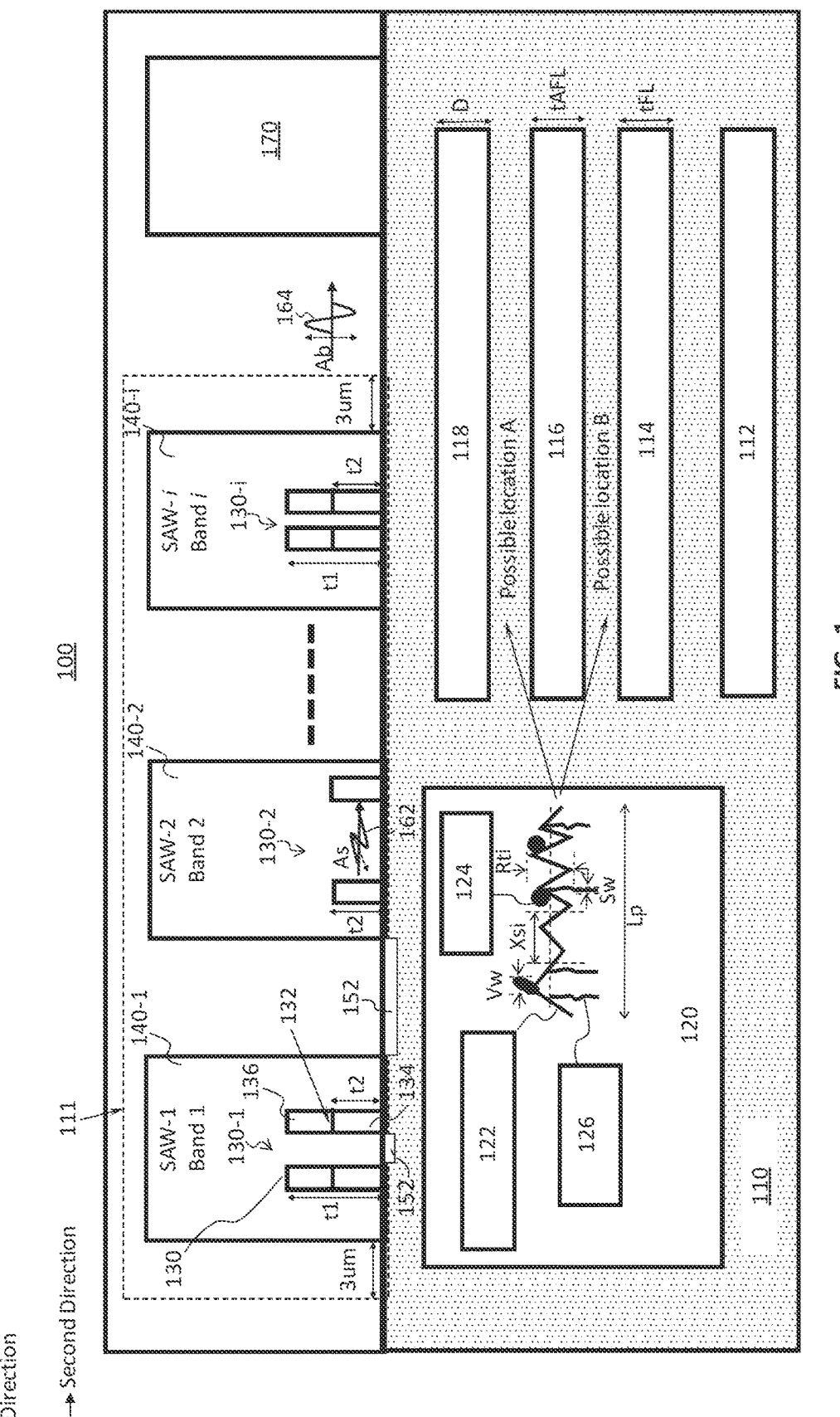
FIG. 1 is a block diagram depicting an illustrative acoustic resonator device in accordance with at least some embodiments of the present disclosure.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, components, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another—although some features or elements may exhibit discrete changes as well. Thus, the elements illustrated in the drawings are schematic in nature and their shapes are not intended to be limited to the precise shape of an element and are not intended to limit the scope of the present disclosure.

It will be understood that when an element such as a region, component, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It is with respect to the above-noted shortcomings of the prior art that the features disclosed herein were contemplated. In particular, various acoustic wave scattering structures are disclosed herein. An acoustic wave scattering structure may be incorporated in an acoustic resonator device for the purposes of reducing or eliminating bulk mode acoustic waves generated therein. This, among other things, may enable the acoustic resonator device to provide one or multiple filter devices within close proximity to one another. As a result, an acoustic resonator device having a generally smaller footprint than previous acoustic resonator devices can be realized.

FIG. 1 depicts a block diagram of an acoustic resonator device 100 in accordance with at least some embodiments of the present disclosure. The diagram of FIG. 1 is a block diagram presented in a simplified manner illustrating building blocks of the acoustic resonator device 100 and how each block interacts with each other. The acoustic resonator device 100 may be an integrated multiband acoustic filter, a surface acoustic wave (SAW) filter, a semiconductor device, or any other type of acoustic resonators. More details about the acoustic resonator device 100, as well as each of the layers and features shown in FIG. 1 will be illustrated and described in more detail with reference to subsequent FIGS. 2 thru 9.

The acoustic resonator device 100, as shown in FIG. 1, is a SAW resonator device. The acoustic resonator device 100 comprises a substrate 110. The substrate 110 is shown to comprise a carrier layer 112, a first layer 114 disposed over the carrier layer 112, a piezoelectric layer 118 disposed over the first layer 114, and an interdigitated metal 130 disposed over the piezoelectric layer 118. The interdigitated metal 130, for example, is configured to generate acoustic waves within an acoustically active region 111. In the embodiment shown in FIG. 1, the carrier layer 112 may include predominantly silicon, and the first layer 114 may include an interlayer. In some embodiments and illustratively, the carrier layer 112 may comprise one or many different types of semiconductor materials. The interlayer provided as part of the first layer 114 may include one or more of the following: $Ta_2O_5$, $SiO_2$, $ZrO_2$, $HfO_2$, AlN, SiN, $Sc_2O_3$, $Cr_2O_3$, $Y_2O_3$, $Yb_2O_3$, or any other suitable material or a combination of materials that are capable of bonding (physically, chemically, or otherwise) the carrier layer 112 and the piezoelectric layer 118.

One or more acoustic wave scattering structures 120 may be disposed within the substrate 110. As will be discussed in further detail herein, the acoustic wave scattering structure 120 may include one or many features that provide acoustic advantages to the acoustic resonator device 100. An acoustic wave scattering structure 120, in one embodiment, is provided in parallel with the carrier layer 112 and substantially or entirely covers the carrier layer 112. In other embodiments, the acoustic wave scattering structure 120 may partially cover the carrier layer 112. The acoustic wave scattering structure 120 may include one or more of an apodized surface 122, a void 124, a substrate seam 126, and/or combinations thereof. In one embodiment, the acoustic wave scattering structure 120 comprises two or more of the apodized surface 122, the void 124, and the substrate seam 126. In some embodiments, the acoustic wave scattering structure 120 comprises the apodized surface 122, the void 124, and the substrate seam 126. In some embodiments, the acoustic wave scattering structure 120 comprises the apodized surface 122, multiple voids 124, and multiple substrate seams 126.

The first layer 114 is shown to have a first layer thickness (tFL) measured in a first direction that is substantially perpendicular relative to a major surface of the carrier layer 112. The first layer thickness (tFL) need not be a completely exact measurement. An exact measurement may be complicated to determine, as the first layer 114 may not have a flat top surface and/or a flat bottom surface. To compute the exact thickness across the entire acoustic resonator device 100 may be excessive and/or unnecessary because what is desirable is a sampling or an estimation that is representative of the first layer thickness (tFL). Therefore, in some embodiments, in cases where the first layer 114 has a non-flat surface, the first layer thickness (tFL) can be estimated by drawing a mean line over the non-flat surface at an estimated average surface depth across a predetermined length taken at any suitable location of the device 100, and then measuring the vertical distance between the top surface and the bottom surface of the layer. This estimation concept may be used for measuring the thickness of all other layers. The first layer thickness (tFL), in the illustrative example shown in FIG. 1, may be measured from a top surface of the carrier layer 112 towards a mean line which extends laterally across a top surface of the first layer 114 taken along a predetermined sampling length (Lp).

The apodized surface 122, as shown in FIG. 1, includes a roughened surface and the surface profile of the apodized surface 122 may be characterized by various suitable parameters. In one embodiment, the apodized surface 122 has a maximum height roughness profile (Rti) within a predetermined sampling length (Lp) measured along the first direction as illustrated in FIG. 1. The maximum height roughness profile (Rti), as shown, refers to the vertical distance between the highest and lowest points of the roughness profile elements of the apodized surface 122 within the predetermined sampling length (Lp). The maximum height roughness profile (Rti) within the predetermined sampling length (Lp), in one embodiment, is approximately more than 1% of the first layer 114 thickness (tFL). In another embodiment, the maximum height roughness profile (Rti) within the predetermined sampling length (Lp) is approximately more than 5% of the first layer thickness (tFL). In yet another embodiment, the maximum height roughness profile (Rti) within the predetermined sampling length (Lp) is approximately more than 25% of the first layer thickness (tFL). The predetermined sampling length (Lp), for example, is approximately between 5 μm and 500 μm. In another embodiment, the predetermined sampling length (Lp), may be between 50 μm and 200 μm. In yet another embodiment, the predetermined sampling length (Lp), may be between 100 μm and 300 μm. The predetermined sampling length (Lp) may be selected to be sufficiently larger (e.g., at least twice as larger) than a size of a feature of interest. For example, if the feature of interest (e.g., one or more features corresponding to the acoustic wave scattering structure 120) has a size of 20 μm the predetermined sampling length (Lp) may be selected to be 50 μm, but not smaller than 20 μm. Illustratively, the first layer thickness (tFL) may be on the order of 4 μm and the roughness profile (Rti) may be on the order of 1 μm.

As described, the apodized surface 122 may be disposed within the substrate 110. In one embodiment, the apodized surface 122 is disposed between the piezoelectric layer 118 and the first layer 114. The apodized surface 122 is located at a first distance (D) measured from a top surface of the substrate 110 in a first direction that is substantially perpendicular relative to the carrier layer 112. The first distance (D), in one example, is measured from a top surface of the piezoelectric layer 118 towards the mean line (not shown) which extends across a bottom surface of the piezoelectric layer 118, which is adjacent to the top surface of the first layer 114. As explained above, the first distance (D) may be determined by measuring from an estimated mean line of a top surface to an estimated mean line of a bottom surface of the piezoelectric layer 118 across a predetermined sampling length (Lp) taken at any location of the device. As described, the apodized surface 122 has a maximum height roughness profile (Rti) within a predetermined sampling length (Lp) measured along the first direction. The maximum height roughness profile (Rti), for example, can be any maximum height roughness profile taken within the predetermined sampling length (Lp). In one embodiment, the maximum height roughness profile (Rti) within the predetermined sampling length (Lp) is approximately more than 0.01% of the first distance (D). In another embodiment, the maximum height roughness profile (Rti) within the predetermined sampling length (Lp) is approximately more than 0.1% of the first distance (D). In yet another embodiment, the maximum height roughness profile (Rti) within the predetermined sampling length (Lp) is approximately more than 1% of the first distance (D). As a more specific, but non-limiting example, the predetermined sampling length (Lp) may be on the order of 5 μm and the first distance (D) may be around 3 μm to around 30 μm. Accordingly, the maximum height roughness profile (Rti) within the predetermined sampling length (Lp) can be approximately more than 25% of the first distance (D).

In another embodiment, the apodized surface 122 has an average maximum height roughness profile (Rti_avg) along the predetermined length measured over a cross-section that is taken perpendicular to the carrier layer 112. The average maximum height roughness profile (Rti_avg) refers to the average of the successive values of maximum height roughness profile (Rti) calculated over the predetermined length (Lp). The average maximum height roughness profile (Rti_avg) is measured along the first direction and the average maximum height roughness profile (Rti_avg), in one embodiment, is approximately more than 0.01% of the first distance (D). In another embodiment, the average maximum height roughness profile (Rti_avg) is approximately more than 0.1% of the first distance (D). In yet another embodiment, the average maximum height roughness profile (Rti_avg) is approximately more than 1% of the first distance (D).

The apodized surface 122 may correspond to a roughened surface that helps reduce or disrupt certain (unwanted) coherent waves in the acoustic resonator device 100. In some embodiments, the apodized surface 122 may be created with sand blasting or a similar process. The profile of the apodized surface 122 may be controlled during production in an effort to control the functioning of the apodized surface 122 as an acoustic wave scattering structure 120. For instance, larger grains of sand may be used during a sand blasting process to crease an apodized surface 122 with larger maximum height roughness profiles (Rti). Other process or material selections may also contribute to a control over other features belonging to the acoustic wave scattering structure. For instance, the viscosity of the material used for the first layer 114 may be selected to fill (or not fill) voids 124 having certain size characteristics. For instance, a more viscous material may be used for the first layer 114 if it is desired to fill more voids 124 (leaving only smaller voids 124) whereas a less viscous material may be used for the first layer 114 if it is desired to fill fewer voids 124.

As shown in FIG. 1, the apodized surface 122 has a spacing measurement of profile irregularities (Xsi) measured in a second direction that is substantially parallel to the carrier layer 112. The spacing measurement of profile irregularities (Xsi), as shown, refers to the width of the roughness profile elements of the apodized surface 122. The spacing measurement of profile irregularities (Xsi), for example, can be any width of the roughness profile elements taken within the predetermined sampling length (Lp). In one embodiment, the spacing measurement of profile irregularities (Xsi) is approximately more than 0.5% of the first distance (D). In another embodiment, the spacing measurement of profile irregularities (Xsi) is approximately more than 5% of the first distance (D). In yet another embodiment, the spacing measurement of profile irregularities (Xsi) is approximately more than 25% of the first distance (D).

The maximum height roughness profile (Rti) within the predetermined sampling length (Lp) of the apodized surface 122 is approximately greater than 0.1% of the spacing measurement of profile irregularities (Xsi). In another embodiment, the maximum height roughness profile (Rti) within the predetermined sampling length (Lp) of the apodized surface 122 is approximately greater than 1% of the spacing measurement of profile irregularities (Xsi). In yet another embodiment, the maximum height roughness profile (Rti) within the predetermined sampling length (Lp) of the apodized surface 122 is approximately greater than 2% of the spacing measurement of profile irregularities (Xsi). In one embodiment where the profile irregularities (Xsi) is relatively small, the maximum height roughness profile (Rti) within the predetermined sampling length (Lp) of the apodized surface 122 is approximately greater than 25% of the spacing measurement of profile irregularities (Xsi).

In another embodiment, the apodized surface 122 has an average spacing measurement of profile irregularities (Xsi_avg) along the predetermined length (Lp) measured over the cross-section. The average spacing measurement of profile irregularities (Xsi_avg) refers to the average of the successive values of spacing measurement of profile irregularities (Xsi) calculated over the predetermined length (Lp). The average spacing measurement of profile irregularities (Xsi_avg), in one embodiment, is approximately more than 0.5% of the first distance (D). In another embodiment, the average spacing measurement of profile irregularities (Xsi_avg) is approximately more than 5% of the first distance (D). In yet another embodiment, the average spacing measurement of profile irregularities (Xsi_avg) is approximately more than 10% of the first distance (D). In one embodiment where the average spacing measurement of profile irregularities (Xsi_avg) is relatively small, the average spacing measurement of profile irregularities (Xsi_avg) is approximately more than 25% of the first distance (D).

The average maximum height roughness profile (Rti_avg), in one embodiment, is approximately more than 0.1% of the average spacing measurement of profile irregularities (Xsi_avg). In another embodiment, the average maximum height roughness profile (Rti_avg) is approximately more than 1% of the average spacing measurement of profile irregularities (Xsi_avg). In yet another embodiment, the average maximum height roughness profile (Rti_avg) is approximately more than 2% of the average spacing measurement of profile irregularities (Xsi_avg). The average maximum height roughness profile (Rti_avg) is approximately more than 1% of the first layer 114 thickness (tFL). In another embodiment, the average maximum height roughness profile (Rti_avg) is approximately more than 10% of the first layer 114 thickness (tFL). In yet another embodiment, the average maximum height roughness profile (Rti_avg) is approximately more than 25% of the first layer 114 thickness (tFL).

The substrate 110 may optionally comprise an additional apodized surface. The additional apodized surface has an additional spacing measurement of profile irregularities (Lsi) which is substantially similar to the spacing measurement of profile irregularities (Xsi) of the apodized surface 122. The additional spacing measurement of profile irregularities (Lsi), for example, refers to the width of the roughness profile elements of the additional apodized surface. In one embodiment, the additional apodized surface is spaced apart from the apodized surface 122 by an apodized surface distance (tAS) measured along the first direction. The apodized surface distance (tAS), in one embodiment, is approximately more than 0.3% of the first distance (D). In another embodiment, the apodized surface distance (tAS) is approximately more than 3% of the first distance (D). In yet another embodiment, the apodized surface distance (tAS) is approximately more than 6% of the first distance (D). In one embodiment where the profile irregularities (Xsi) is relatively small, the apodized surface distance (tAS) is approximately more than 25% of the first distance (D).

The substrate 110, for example, may optionally comprise a second layer 116 which is disposed between the first layer 114 and the piezoelectric layer 118. In such case, the apodized surface 122 is disposed between the piezoelectric layer 118 and the second layer 116 (referred to as position location A in FIG. 1), while the additional apodized surface is disposed between the first layer 114 and the second layer 116 (referred to as position location B in FIG. 1). In some embodiments, the second layer 116 comprises an interlayer. The second layer 116 may comprise a different material than the material of the first layer 114. The second layer 116, in one embodiment, has a thickness (tAFL) that is approximately less than 100% of the first layer thickness (tFL) of the first layer 114. In another embodiment, the thickness (tAFL) of the second layer 116 is approximately less than 50% of the first layer thickness (tFL) of the first layer 114. In yet another embodiment, the thickness (tAFL) of the second layer 116 is approximately less than 25% of the first layer thickness (tFL) of the first layer 114. As explained above, the thickness (tAFL) of the second layer 116 may be determined by measuring from an estimated mean line of a top surface to an estimated mean line of a bottom surface of the second layer 116 across a predetermined sampling length (Lp) taken at any location of the acoustic resonator device 100.

In another embodiment, the acoustic wave scattering structure 120 may further comprise one or a plurality of voids 124. The plurality of voids 124, as shown in FIG. 1 are disposed proximate to the apodized surface 122. One of the plurality of voids 124 has a void width (Vw) measured along the second direction as shown in FIG. 1. A void width (Vw) may correspond to a distance measured from one open end of the void 124 to an opposing open end of the void 124 in the second direction. In one embodiment, the void width (Vw) is approximately less than 50% of the spacing measurement of profile irregularities (Xsi). In another embodiment, the void width (Vw) is approximately less than 30% of the spacing measurement of a profile irregularities (Xsi). In yet another embodiment, the void width (Vw) is approximately less than 15% of the spacing measurement of a profile irregularities (Xsi).

As shown in FIG. 1, at least one of the plurality of voids 124 may be in direct contact with the apodized surface 122. In an alternate embodiment, at least one of the plurality of voids 124 is distanced away from the apodized surface 122. As described, the apodized surface 122 may be disposed between the first layer 114 and the piezoelectric layer 118. In such case, at least one of the plurality of voids 124 may be disposed within the piezoelectric layer 118. Alternatively, at least one of the plurality of voids 124 may be disposed within the first layer 114. In yet another embodiment, at least one of the plurality of voids 124 is disposed both partially within the first layer 114 and partially within the piezoelectric layer 118.

The acoustic wave scattering structure 120, in another embodiment, may comprise a plurality of substrate seams 126. The plurality of substrate seams 126, for example, may comprise irregularly shaped crack lines. As shown in FIG. 1, one of the plurality of substrate seams 126 has a substrate seam width (Sw) measured along the second direction. The substrate seam width (Sw), in one embodiment, is approximately less than 5% of the spacing measurement of profile irregularities (Xsi). In another embodiment, the substrate seam width (Sw) is approximately less than 3% of the spacing measurement of profile irregularities (Xsi). In yet another embodiment, the substrate seam width (Sw) is approximately less than 1.5% of the spacing measurement of profile irregularities (Xsi).

The acoustic wave scattering structure 120 may comprise at least one void 124 and at least one substrate seam 126. In such example, the at least one void 124 has a void width (Vw) measured along the second direction that is less than 50% of the spacing measurement of profile irregularities (Xsi), and the at least one substrate seam 126 has a substrate seam width (Sw) measured along the second direction that is less than 50% of the void width (Vw).

As shown in FIG. 1, at least one of the plurality of substrate seams 126 is in direct contact with at least one of the plurality of voids 124. At least one of the plurality of voids 124 is located at one end of one of the plurality of substrate seams 126. In one embodiments, at least two or more of the plurality of substrate seams 126 extend from at least one void 124 in different directions compared to each other. In another embodiment, one or more of the plurality of voids 124 is elongated in shape and oriented in a first direction that forms an angle between 70 and 170 degrees relative to an adjacent substrate seam 126 that is oriented in a second direction.

Referring to FIG. 1, a first portion of the plurality of substrate seams 126 extends substantially in parallel to a direction that is perpendicular to the carrier layer 112. Some of the plurality of substrate seams 126 may have a second portion that extend substantially orthogonal to the first portion of substrate seams 126. In such example, one of the second portions of the plurality of substrate seams 126 is connected to two of the plurality of substrate seams 126 that are located next to each other forming a U-shaped substrate seam structure.

The plurality of substrate seams 126, for example, extend within at least one of the layers of the substrate 110. In one embodiment, at least one of the plurality of substrate seams 126 extends partially into the first layer 114. It is also observed that, in some embodiments, at least one of the plurality of substrate seams 126 extends entirely across the first layer 114 (e.g., spans the first layer 114).

One of the plurality of substrate seams 126 may extend beyond one of the layers of the substrate 110 into a neighboring layer within the substrate 110. For example, in embodiments where the substrate 110 has a second layer 116 disposed between the piezoelectric layer 118 and the first layer 114, at least one of the plurality of substrate seams 126 extends across the first layer 114 and at least partially into the second layer 116. In yet another embodiment, at least one of the plurality of substrate seams 126 extends beyond two layers of the substrate 110 such that the at least one of the plurality of substrate seams 126 crosses completely over one layer of the substrate 110. For example, in some embodiments, at least one of the plurality of substrate seams 126 extends across or spans the first layer 114 and the second layer 116.

In some embodiments, at least one of the plurality of substrate seams 126 extends from a portion of the first layer 114 into a portion of the second layer 116. In yet another embodiment, at least one of the plurality of the substrate seams 126 extends partially within the first layer 114.

As discussed, the plurality of substrate seams 126 may extend in one or more layers within the substrate 110. In one embodiment, the plurality of substrate seams 126 does not extend into the carrier layer 112. In other words, the carrier layer 112 is devoid of the plurality of substrate seams 126.

Referring still to FIG. 1, the acoustic resonator device 100, may comprise two or more acoustic filters (140-1, 140-2 . . . 140-i) having at least a first filter device 140-1 corresponding to a first bandwidth and a second filter device 140-2 corresponding to a second bandwidth that is distinguishable from the first bandwidth such that the first filter device 140-1 and the second filter device 140-2 are operable in two different communication channels. In an example where there are three acoustic filters in the acoustic resonator device 100, the third acoustic filter, for example, comprises a third acoustic filter device corresponding to a third bandwidth that is distinguishable or different from the first bandwidth and the second bandwidth. The first bandwidth, the second bandwidth, and the third bandwidth, for example, may be in the range of 1400 MHz to 2700 MHz (sometimes referred to as the mid-high bands). Alternatively, or additionally, one or more of the first bandwidth, second bandwidth, and third bandwidth may be in the low band (e.g., 600 MHz to 12 MHz) and/or ultra-high bands (e.g., 2.8 GHz to 6 GHz). Other suitable bandwidth range may also be applicable.

As shown, each of the two or more acoustic filters (140-1, 140-2 . . . 140-i) comprises an interdigitated metal (130-1, 130-2 . . . 130-i), where the interdigitated metal (130-1, 130-2 . . . 130-i) has one of a first thickness (t1) and a second thickness (t2). The second thickness (t2) is different from the first thickness (t1) measuring perpendicularly from the substrate 110. In one embodiment, the first thickness (t1) is greater than the second thickness (t2). For example, the first thickness (t1) may be about 1.5 times the second thickness (t2). As illustrated in FIG. 1, the interdigitated metal 130-1 of the first filter device 140-1 has the first thickness (t1), the interdigitated metal 130-2 of the second filter device 140-2 has the second thickness (t2), and the first thickness (t1) is greater than the second thickness (t2).

In one embodiment, the interdigitated metal 130-1 of the first filter device 140-1 comprises a metal seam 132. The metal seam 132, in some embodiments, comprises a separation line of two different metal materials, or a separation line of the same metal materials caused by the different timing, sequence or steps of formation of the interdigitated metal (130-1, 130-2 . . . 130-i). For example, the metal seam 132 may comprise a separation line caused by two different metallic bondings of the interdigitated metal 130-1. In another example, the metal seam 132 may be defined by a different tone as observed within the interdigitated metal 130-1 because of the portions below and above the separation line are formed at a different process steps or after a long-time interval.

In the embodiment of FIG. 1, the interdigitated metal 130-1 of the first filter device 140-1 may comprise a first sublayer 134 and a second sublayer 136 separated by the metal seam 132. The first sublayer 134, may predominately be formed of a first metallic material, and the second sublayer 136 comprises predominantly a second metallic material. The first metallic material, in one example, is the same as the second metallic material. For example, the first metallic material and the second metallic material comprises Aluminum. In another example, the first metallic material is different from the second metallic material. By way of an example, the first metallic material comprises Titanium and the second metallic material comprises Aluminum or vice-versa. Other suitable metallic materials may also be used for one or both of the first metallic material and the second metallic material.

The first sublayer 134, for example, may comprise a first grain size and the second sublayer 136 may comprise a second grain size that is different than the first grain size (e.g., larger grain size or smaller grain size). The differences in the first sublayer 134 and the second sublayer 136 may result in a different appearance such as tonality, which define the separation line defining the metal seam 132 as discussed above. In some embodiments, the metal seam 132 is formed at a height that corresponds to a thickness or height of the second thickness (t2) even though more than one metal layer may have been used to form the interdigitated metal 130-1 leading up to the formation of the metal seam 132. Said another way, the metal seam 132 is displaced from the top surface of the substrate 110 at a height that is approximately equal to the second thickness (t2).

Referring to FIG. 1, the first sublayer 134 comprises a first sublayer thickness and the second sublayer 136 comprises a second sublayer thickness that is different than the first sublayer thickness. In some embodiments, first sublayer thickness is greater than the second sublayer thickness. The second sublayer thickness may be less than 50% of the first sub-layer thickness. In another embodiment, the second sublayer thickness may be less than 15% of the first sub-layer thickness. In yet another embodiment, the second sublayer thickness may be less than 10% of the first sub-layer thickness. The first thickness (t1), as shown in FIG. 1, is thicker than the second thickness (t2) by approximately the second sublayer thickness. In another example, the second thickness (t2) and the first sublayer thickness are substantially similar.

As shown in FIG. 1, the interdigitated metal 130-1 of the first filter device comprises 140-1 a first pitch separating a plurality of first fingers of the interdigitated metal 130-1, and the interdigitated metal 130-2 of the second filter device 140-2 comprises a second pitch separating a plurality of second fingers of the interdigitated metal. In one embodiment, the first pitch is different from the second pitch. Each of the interdigitated metals (130-1, 130-2 . . . 130-i) of the two or more acoustic filters (140-1, 140-2 . . . 140-i), for example, is disposed over a top planar portion of the substrate 110 as illustrated in FIG. 1.

In another embodiment, at least one of the interdigitated metals (130-1, 130-2 . . . 130-i) of the two or more acoustic filters (140-1, 140-2 . . . 140-i) is disposed on the first top portion of the substrate 110, and the first top portion of the substrate 110 comprises at least an undercut or recess 152 adjacent to a finger of the at least one of the interdigitated metals (130-1, 130-2 . . . 130-i) of the two or more acoustic filters (140-1, 140-2 . . . 140-i). The undercut 152 is less than 15% of the first thickness (t1). In another embodiment, the undercut is less than 10% of the second thickness (t2). In yet another embodiment, an undercut (not shown in FIG. 1) is disposed between the interdigitated metal 130-1 of the first filter device 140-1, and the interdigitated metal 130-2 of the second filter device 140-2. In some embodiments, an undercut (not shown) may be disposed between a plurality of fingers of the interdigitated metal 130-2 of the second filter device 140-2.

The acoustic resonator device 100, in one embodiment, may comprise an etch stop layer (not shown in FIG. 1). In one example, each of the interdigitated metals (130-1, 130-2 . . . 130-i) of the two or more acoustic filters (140-1, 140-2 . . . 140-i) is disposed over an etch stop layer. The etch stop layer, for example, may be disposed in between a top surface of the substrate 110 and a bottom surface of the interdigitated metals (130-1, 130-2 . . . 130-i) of the two or more acoustic filters (140-1, 140-2 . . . 140-i). By way of an example, the etch stop layer may comprise a thickness that is less than 50 Å. Other suitable thickness dimension may also be applicable.

The acoustic resonator device 100 may optionally comprise a filter circuit 170 as shown in FIG. 1. The filter circuit 170, for example, may comprise one or multiple passive circuit elements, such as at least one of an inductor, a capacitor, and a resistor. Other suitable active or passive components may also be applicable and provided in the filter circuit 170.

In one embodiment, the acoustic resonator device 100 comprises at least a first set of interdigitated metals 130-1 and a second set of interdigitated metals 130-2 disposed on the substrate 110. The first set of interdigitated metals 130-1 and the second set of interdigitated metals 130-2 may correspond to or operate for the same bandwidth or different bandwidths. Each of the first set of interdigitated metals 130-1, in one embodiment, comprises a metal seam 132. As shown, the first set of interdigitated metals 130-1 comprises a first thickness (t1) measured substantially orthogonal to the substrate 110, and the second set of interdigitated metals 130-2 comprises a second thickness (t2) measured substantially orthogonal to the substrate 110. The second thickness (t2), for example, is less than the first thickness (t1) as shown in FIG. 1. The metal seam 132 separates the first thickness (t1) into a first sublayer thickness and a second sublayer thickness, and the first sublayer thickness is substantially equal to the second thickness (t2). The metal seam 132 is also shown as being formed at a height that is substantially equal to or corresponding with the second thickness (t2). The acoustic resonator device 100 may comprise three or more acoustic filters (140-1, 140-2 . . . 140-i). In one embodiment, each of the three or more acoustic filters (140-1, 140-2 . . . 140-i) comprises one of the first set of interdigitated metals 130-1 and the second set of interdigitated metals 130-2.

As described, the acoustic resonator device 100 comprises a first filter device 140-1 and a second filter device 140-2. In one embodiment, the first filter device 140-1 has an inter-digitated metal 130-1 and the second filter device 140-2 has an interdigitated metal 130-2. The interdigitated metal 130-1 of the first filter device 140-1 may be in the form of a plurality of first fingers disposed on a first portion of the substrate 110 that is substantially planar, and the interdigitated metal 130-2 of the second filter device 140-2 may be in the form of a plurality of second fingers disposed on a second portion of the substrate 110 that comprises at least a recess 152. The recess 152, in one example, is disposed adjacent to one of the first fingers and one of the second fingers (see e.g., FIGS. 5A and/or 5B). In another example, the recess 152 is disposed in between one of the first fingers and one of the second fingers. The substrate 110 may comprise additional recess (not shown). In such case, the additional recess may be disposed between the plurality of first fingers and the plurality of second fingers. The plurality of first fingers comprise a first thickness (t1) measured orthogonal to the substrate 110. The plurality of second fingers comprise a second thickness (t2) measured orthogonal to the substrate 110. In one embodiment, the first thickness (t1) and the second thickness (t2) are different from each other as shown in FIG. 1.

As described, the acoustic resonator device 100 comprises a first filter device 140-1 corresponding to a first bandwidth and a second filter device 140-2 corresponding to a second bandwidth that is distinguishable from the first bandwidth. In one embodiment, the first filter device 140-1 comprises an interdigitated metal 130-1 in the form of a first set of metal layers having a first thickness (t1) measuring perpendicularly from the substrate 110 and a metal seam 132, and the second filter device 140-2 comprises an interdigitated metal 130-2 in the form of a second set of metal layers having a second thickness (t2) that is different from the first thickness (t1). The acoustic resonator device 100 further comprises the acoustic wave scattering structure 120 disposed within the substrate 110 as described in earlier paragraphs. The acoustic wave scattering structure 120, in one embodiment, is configured to incoherently scatter acoustic waves that are launched into a bulk region of a piezoelectric layer 118 of the substrate 110, and thereby acoustically isolates the first filter device 140-1 from the second filter device 140-2 (as well as other filter devices 140-i) on the same substrate 110.

As presented earlier, the acoustic resonator device 100 comprises a substrate 110 having a carrier layer 112, a first layer 114 disposed over the carrier layer 112, and a piezoelectric layer 118 disposed over the first layer 114. An interdigitated metal 130 is disposed over the piezoelectric layer 118 of the substrate 110 defining therein an acoustic track, which may also be referred to as or comprise an acoustically active region 111. The acoustic track are regions between the interdigitated metal 130 where the acoustic waves are trapped. The acoustic track, in one example, may comprise a region of the substrate 110 within 3 µm from a boundary of the interdigitated metal 130. The interdigitated metal 130 is configured to generate acoustic waves. The acoustic waves comprise a lateral component having a wave amplitude displacement substantially on a horizontal plane that is substantially parallel with the substrate 110, and a non-horizontal component launched into the piezoelectric layer 118 that has a wave amplitude displacement that is outside of the horizontal plane. In one embodiment, the acoustic resonator device 100 comprises an acoustic wave scattering structure 120 within the substrate 110 that is distanced away from but sufficiently close to the interdigitated metal 130 so as to at least scatter the non-horizontal component of the acoustic waves. The lateral component of the acoustic wave, for example, comprises a shear mode acoustic wave 162 trapped under the acoustic track.

The interdigitated metal 130 and the acoustic track as described in the preceding paragraph are portions of a first filter device 140-1 disposed on the substrate 110. As discussed earlier, the acoustic resonator device 100 may further comprise a second filter device 140-2 having an additional interdigitated metal 130-2 located adjacent to an additional acoustic track. The acoustic wave scattering structure 120, in one embodiment, is configured to scatter the acoustic wave such that the non-horizontal component is inhibited from acoustically interfering the second filter device 140-2. The acoustic wave scattering structure 120, for example, is configured to scatter the acoustic waves so as to prevent the acoustic waves from becoming coherent outside of the acoustic track.

The vertical component of the acoustic waves, for example, comprises a bulk mode acoustic wave 164. The bulk mode acoustic wave 164 has a maximum vertical amplitude displacement measurable at a location outside of the acoustic track. The bulk mode acoustic wave 164 has a mean vertical amplitude displacement that represents an average value of the vertical amplitude displacement measurable at a plurality of representative locations outside the acoustic track at the same time during the measurement of the maximum vertical amplitude displacement. In one embodiment, the acoustic wave scattering structure 120 is configured to scatter the acoustic waves such that the maximum vertical amplitude displacement measured is not more than 50% larger than the mean vertical amplitude displacement. The vertical amplitude displacement may be measured by an Acoustical Imaging Microscope (AIM), which is based on the photo-refractive (PR) interferometric technique. Other suitable techniques may also be employed.

In another embodiment, the acoustic wave scattering structure 120 is configured to scatter the acoustic waves in a bulk region of the piezoelectric layer 118 such that the maximum vertical amplitude displacement, for a power ranging between 10 mW and 5000 mW, is less than a displacement of 200 nm across the substrate 110 for a predetermined frequency selected from 1 MHz to 100 GHz frequency range.

As described, the acoustic track may be defined, at least partially, by the interdigitated metal 130. In yet another embodiment, the interdigitated metal 130 is configured to generate acoustic waves that have a maximum amplitude of vertical displacement. The acoustic wave scattering structure 120 which is located within the substrate 110, for example, is configured to incoherently scatter the acoustic waves that are launched into a bulk region of the piezoelectric layer 118, and thereby preventing formation of coherent waves outside of the acoustic track.

The apodized surface 122, as shown in FIG. 1, is disposed between the piezoelectric layer 118 and the carrier layer 112. In one embodiment, the apodized surface 122 is disposed between the first layer 114 and the piezoelectric layer 118. In another embodiment, the acoustic resonator device 100 may optionally comprise an additional apodized surface 122 disposed between the carrier layer 112 and the first layer 114. In yet another embodiment, the acoustic resonator device 100 may further comprise a second layer 116 disposed between the first layer 114 and the piezoelectric layer 118. In such case, the apodized surface 122 is disposed between the piezoelectric layer 118 and the second layer 116 (referred to as possible location A in FIG. 1), and there may be an additional apodized surface 122 being disposed between the first layer 114 and the second layer 116 (referred to as possible location B in FIG. 1).

Various thickness and width dimensions, numerical and percentage values, materials have been disclosed herein as non-limiting examples in the present disclosure. It is understood that the other dimensions, numerical and percentage values and materials may also be employed as long as they are suitable for the intended use or purpose.

Figure 2A:
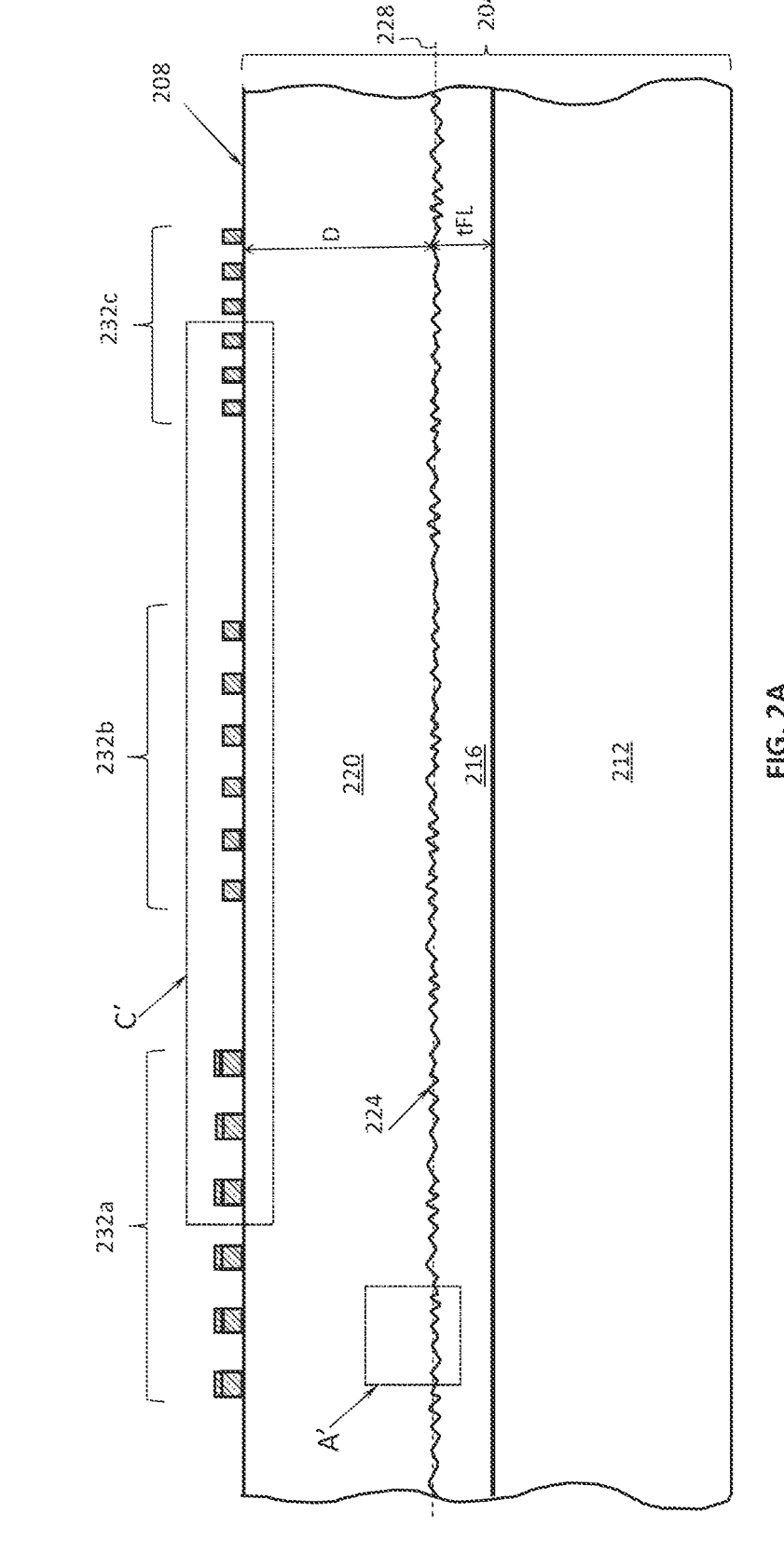
FIG. 2A is a cross-sectional view of another illustrative acoustic resonator device in accordance with at least some embodiments of the present disclosure.

Referring now to FIGS. 2A thru 4C, additional details of acoustic resonator device 100 will be described in accordance with at least some embodiments of the present disclosure. FIG. 2A illustrates one example of an acoustic resonator device 100 having a substrate 204 with a top surface 208 on which interdigitated metals 232a, 232b, 232c are provided. In some embodiments, the substrate 204 may be similar or identical to substrate 110. The interdigitated metals 232a, 232b, 232c may be similar or identical to the interdigitated metals 130-1, 130-2, 130-i, which are each configured to operate as acoustic filters 140-1, 140-2, 140-i, in the acoustic resonator device 100.

The substrate 204 is shown to include a carrier layer 212 with a first layer 216 and piezoelectric layer 220 provided thereon. The first layer 216 is shown as being disposed between the carrier layer 212 and the piezoelectric layer 220. The carrier layer 212 may be similar or identical to the carrier layer 112. The first layer 216 may be similar or identical to the first layer 114. The piezoelectric layer 220 may be similar or identical to the piezoelectric layer 118. The apodized surface 224 may be similar or identical to the apodized surface 122.

FIG. 2A also depicts the apodized surface 224 being provided between the first layer 216 and the piezoelectric layer 220. As discussed above, features or elements of the apodized surface 224 may be used to define, discern, or otherwise determine a position of a mean line 228. In some embodiments, the mean line 228 extends through features of the apodized surface 224 and the mean line 228 generally extends in a direction parallel to the second direction (e.g., parallel to the top surface 208 of the substrate 204). In some embodiments, the position of the mean line 228 is determined or provided such that approximately half of the elements of the apodized surface 224 are above the mean line 228 and the remaining half of the elements of the apodized surface 224 are below the mean line 228.

It can also be seen in FIG. 2A that the first layer thickness (tFL) may be less than the first distance (D). In other words, the first layer thickness (tFL) as measured in the first direction may be less than a thickness of the piezoelectric layer 220 measured in the first direction. In some embodiments, the first layer thickness (tFL) may correspond to a linear distance measured in the first direction between the top surface of the carrier layer 212 and the mean line 228. The first distance (D) may correspond to a linear distance measured in the first direction between the top surface 208 of the substrate 204 and the mean line 228. In some embodiments, a sum of the first layer thickness (tFL) and the first distance (D) may correspond to a linear distance between the carrier layer 212 and the top surface 208 of the substrate 204.

Figure 2B:
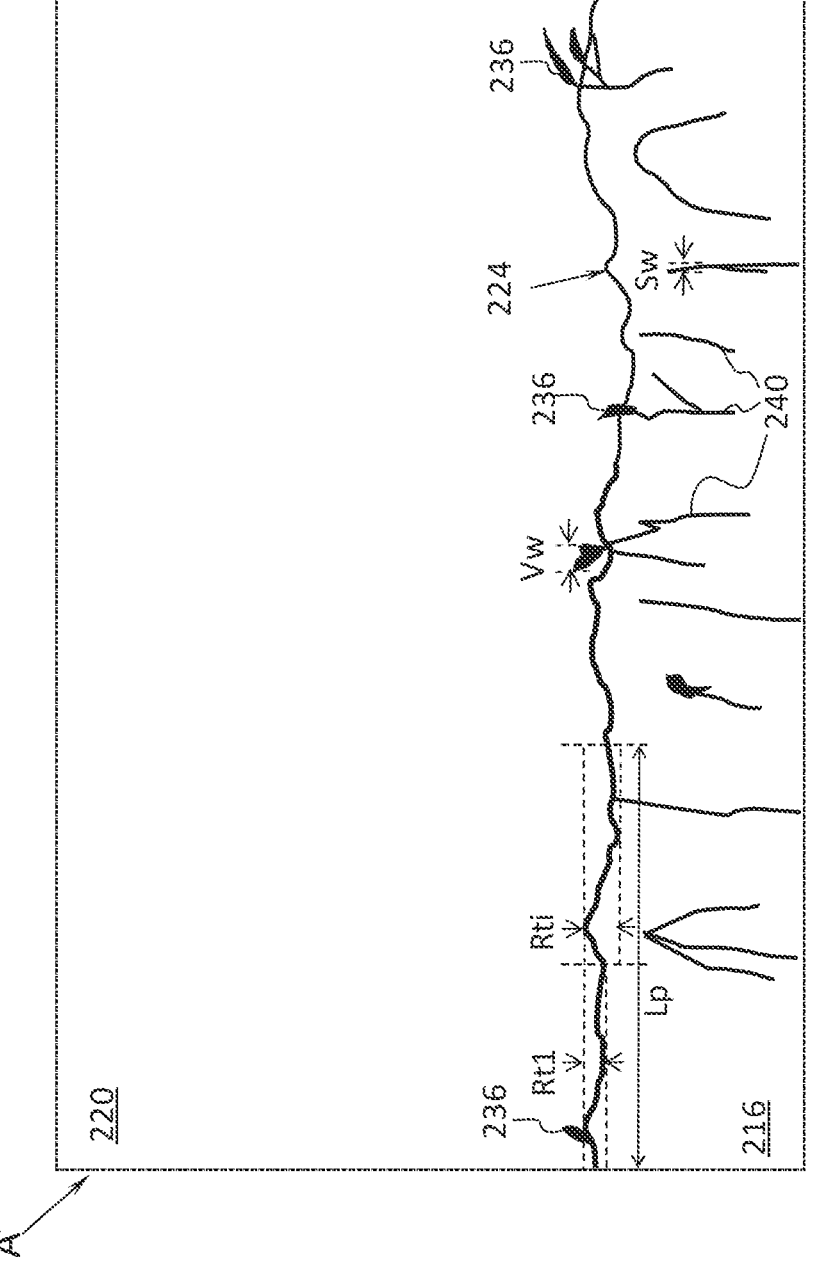
FIG. 2B is a detailed view illustrating details of area A' from FIG. 2A in accordance with at least some embodiments of the present disclosure.
Figure 2C:
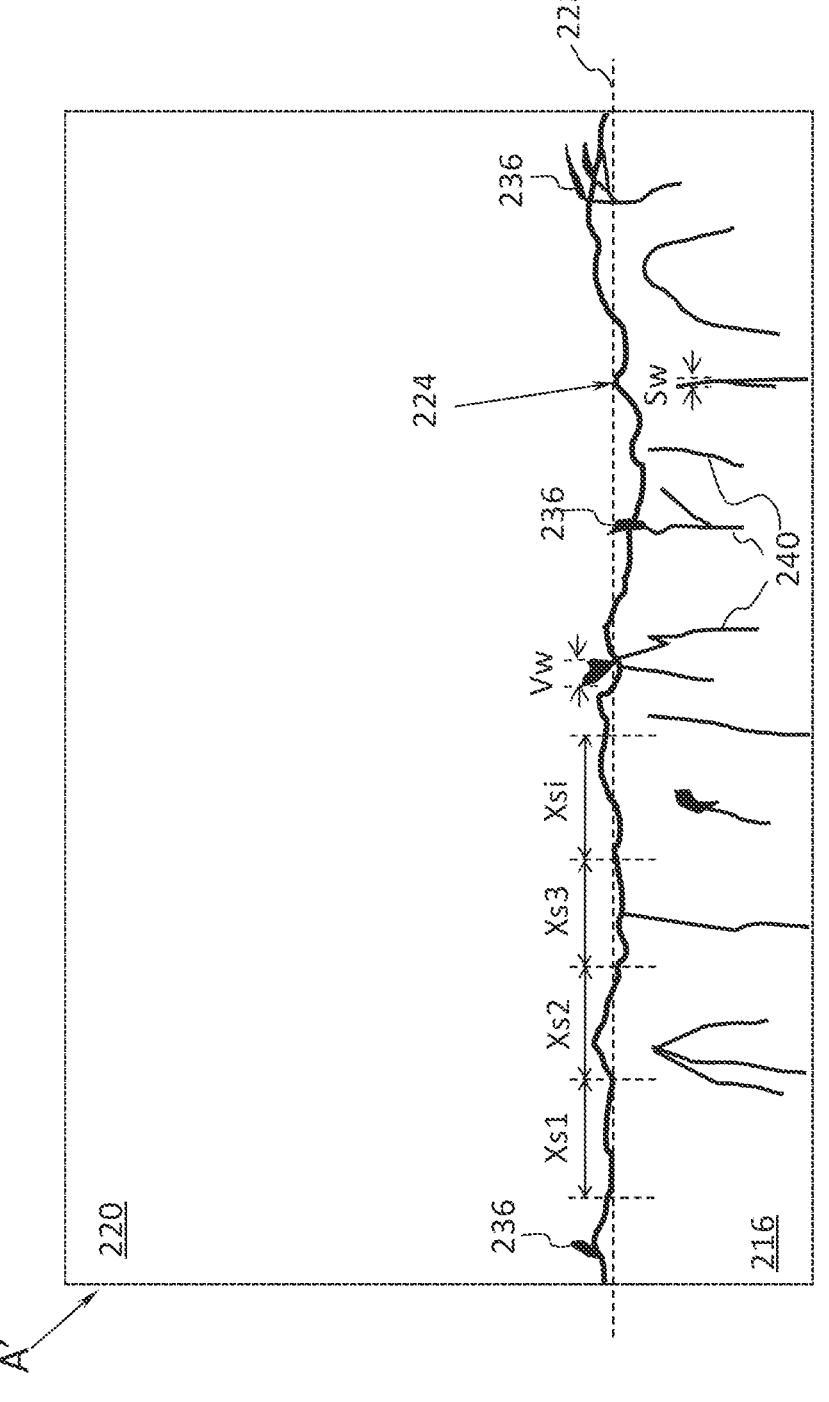
FIG. 2C is another detailed view illustrating further details of area A' from FIG. 2A in accordance with at least some embodiments of the present disclosure.

FIGS. 2B and 2C illustrate additional details of the area A', highlighting the interface between the first layer 216 and the piezoelectric layer 220. Specifically, embodiments of the present disclosure contemplate that one or more acoustic wave scattering structures 120 may be provided at or near the interface between the first layer 216 and the piezoelectric layer 220. In some embodiments, the one or more acoustic wave scattering structures 120 may include, without limitation, the apodized surface 224, one or more voids 236, and/or one or more substrate seams 240. The acoustic wave scattering structure 120 may include just the apodized surface, a single void 236, a single substrate seam 240, a plurality of voids 236, a plurality of substrate seams 240, or various combinations thereof.

The apodized surface 224 is shown to have a maximum height roughness profile (Rti) within each spacing measurement of profile irregularities (Xsi) measured in the second direction that is substantially parallel to the top surface 208. The spacing measurement of profile irregularities (Xsi) corresponds to the width of the roughness profile elements of the apodized surface 224. The spacing measurement of profile irregularities (Xsi), for example, can be any width of the roughness profile elements taken within the predetermined sampling length (Lp) and each spacing measurement of profile irregularities (Xsi) may have a unique maximum height roughness profile (Rti).

It can also be seen that one or more voids 236 may be provided on or near the apodized surface 224 and the one or more voids 236 may also contribute to the acoustic wave scattering structure 120. In some embodiments, a void 236 may contact the apodized surface 224. In some embodiments, a void 236 may be provided just above or just below the apodized surface 224. Said another way, a void 236 may exist solely within the first layer 216, solely within the piezoelectric layer 220, or span the apodized surface 224 such that it partially exists within both the first layer 216 and the piezoelectric layer 220. A void 236 may also be in contact or connect to a substrate seam 240, although such a configuration is not required. In some embodiments, a void 236 that contributes to the acoustic wave scattering structure 120 may be within a distance of the apodized surface 224 that is less than or equal to a distance defined by the largest maximum height roughness profile (Rti), although FIG. 2B depicts at least one void 236 that is provided a further distance away from the apodized surface 224.

In some embodiments, a void 236 may have a void width (Vw) and a size of the void width (Vw) may be approximately less than 50% of the spacing measurement of profile irregularities (Xsi). In another embodiment, the void width (Vw) is approximately less than 30% of the spacing measurement of a profile irregularities (Xsi).

The substrate seam 240 may correspond to another example of an acoustic wave scattering structure 120. Each substrate seam 240 may have a substrate seam width (Sw) that is measured in the second direction. A substrate seam width (Sw) may be approximately less than 5% of the spacing measurement of profile irregularities (Xsi). In another embodiment, the substrate seam width (Sw) is approximately less than 3% of the spacing measurement of profile irregularities (Xsi).

It may also be possible to characterize dimensions of one or more acoustic wave scattering structures 120 with respect to a dimension of the first layer 216. In some embodiments, the maximum height roughness profile (Rti) may be less than 25% or 30% of the first layer thickness (tFL). In some embodiments, the void width (Vw) may be less than 5% of the first layer thickness (tFL). In some embodiments, the substrate seam width (Sw) may be less than 5% of the first layer thickness (tFL). In other embodiments, one or more of the maximum height roughness profile (Rti), the void width (Vw), and substrate seam width (Sw) may be less than 2% of the first layer thickness (tFL).

With reference to FIG. 2C, it can be seen that the apodized surface 224 may have two, three, or more spacing measurement of profile irregularities (Xsi) measured in a second direction. One of the spacing measurement of profile irregularities (Xsi) may be adjacent to another spacing measurement of profile irregularities (Xsi) and the dimensions of adjacent spacing measurement of profile irregularities (Xsi) may be the same or different. Each spacing measurement of profile irregularities (Xs1, Xs2, Xs3, Xsi) may have a different maximum height roughness profile (Rti). One or more of the spacing measurement of profile irregularities (Xs1, Xs2, Xs3, Xsi) may also have a void 236 provided therein and/or a substrate seam 240 provided therein without departing from the scope of the present disclosure.

Figure 3A:
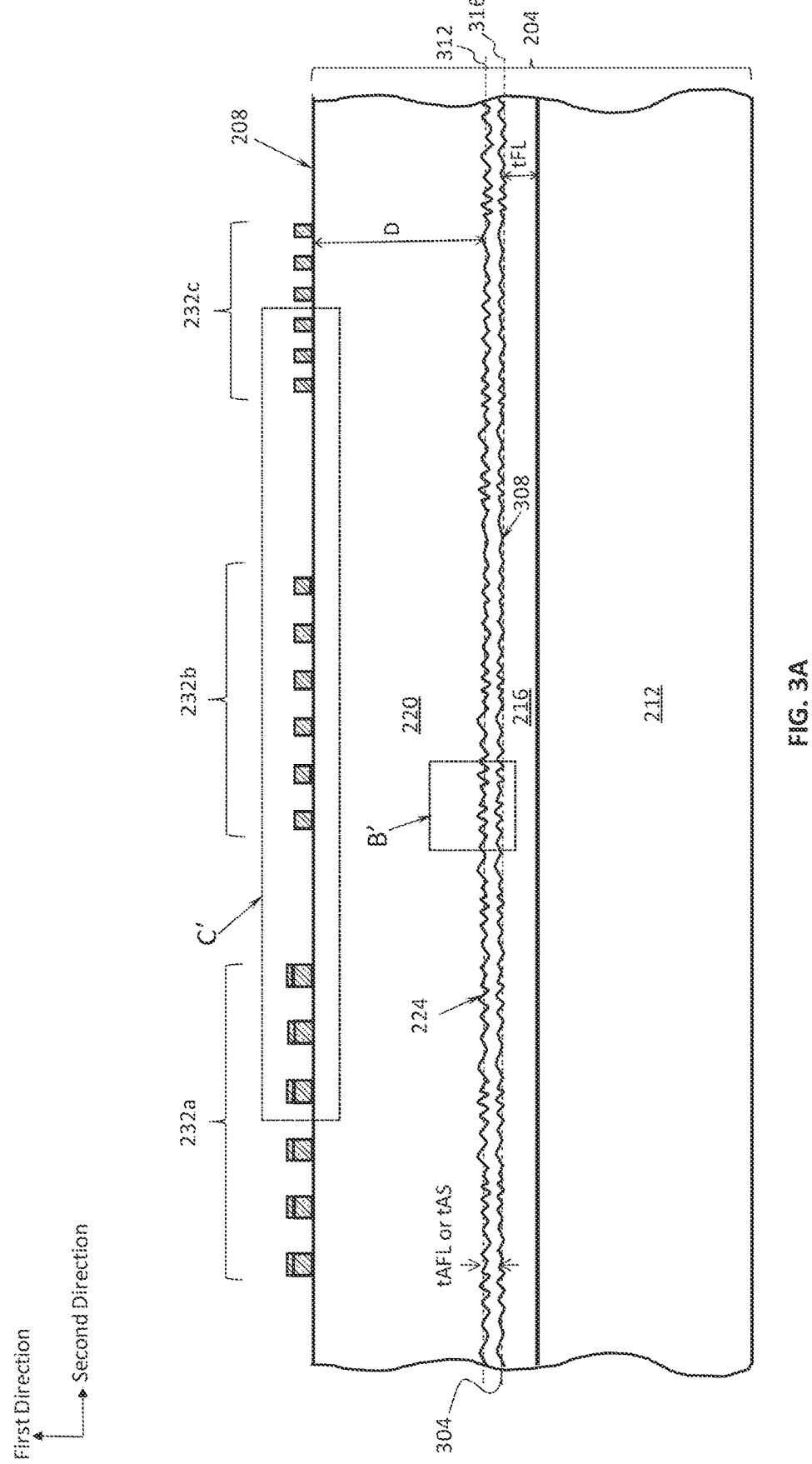
FIG. 3A is a cross-sectional view of another illustrative acoustic resonator device in accordance with at least some embodiments of the present disclosure.
Figure 3B:
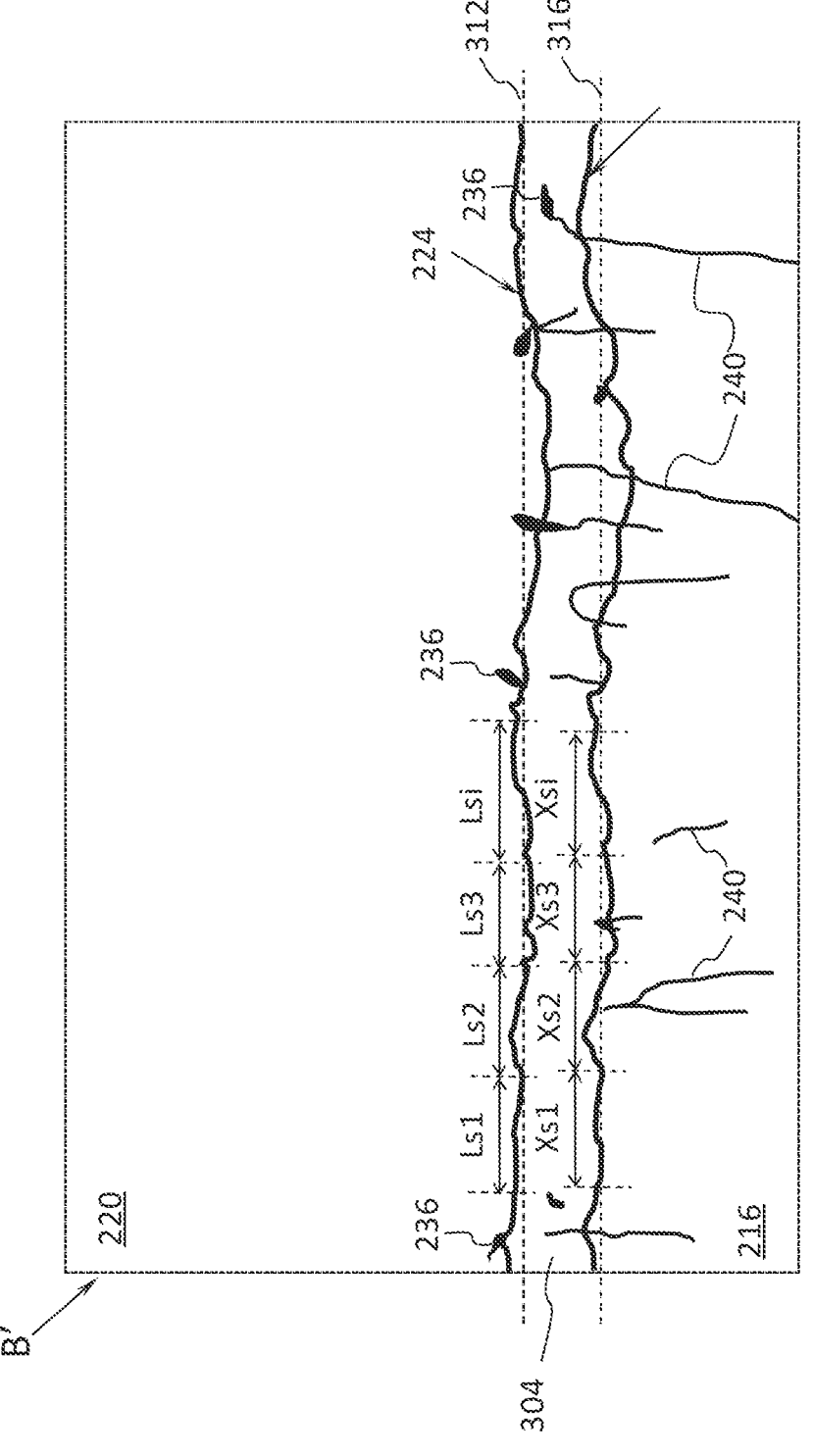
FIG. 3B is a detailed view illustrating details of area B' from FIG. 3A in accordance with at least some embodiments of the present disclosure.

Referring now to FIGS. 3A and 3B, additional details of an acoustic resonator device 100 having a second layer 304 will be described in accordance with at least some embodiments of the present disclosure. The second layer 304 is shown to be provided between the first layer 216 and the piezoelectric layer 220. The second layer 304 may be similar or identical to the second layer 116. The second layer 304 may be positioned between the apodized surface 224 and an additional apodized surface 308, which may correspond to another example acoustic wave scattering structure 120. The additional apodized surface 308 may be similar in structure and content to the apodized surface 224, but may be spaced apart from the apodized surface 224 by an apodized surface distance (tAS), which may also correspond to the thickness (tAFL) of the second layer 304. In some embodiments, the apodized surface distance (tAS) or thickness (tAFL) of the second layer 304 may correspond to a linear distance measured in the first direction between a first mean line 312 and a second mean line 316, where the first mean line 312 is defined by elements of the apodized surface 224 and the second mean line 316 is defined by elements of the additional apodized surface 308. The first mean line 312 may extend substantially parallel with the second mean line 316 and both lines may extend substantially parallel with the top surface 208 of the substrate 204.

One or more voids 236 may be provided proximate to or in contact with the apodized surface 224 whereas one or more other voids 236 may be provided proximate to or in contact with the additional apodized surface 308. Likewise, one or more substrate seams 240 may bisect the apodized surface 224 whereas other substrate seams 240 may bisect the additional apodized surface 308. It may also be possible for one or more substrate seams 240 to bisect both the apodized surface 224 and the additional apodized surface 308. There may also be one or more substrate seams 240 that have a U-shape and bisect at least one of the apodized surfaces 224, 308 more than once.

The additional apodized surface 308 is further shown to include an additional spacing measurement of profile irregularities (Lsi) which is substantially similar to the spacing measurement of profile irregularities (Xsi) of the apodized surface 224. The additional spacing measurement of profile irregularities (Lsi), for example, refers to the width of the roughness profile elements of the additional apodized surface 308. It should be appreciated that the additional spacing measurement of profile irregularities (Lsi) of the additional apodized surface 308 may or may not be the same size as a spacing measurement of profile irregularities (Xsi) of the apodized surface 224. One or more acoustic wave scattering structures 120 (e.g., the apodized surface 224, the additional apodized surface 308, a void 236, and/or a substrate seam 240) may be provided entirely within the second layer 304 and may not necessarily extend beyond either the first median line 312 or second median line 316. As an example, a void 236 may be provided entirely within the second layer 304 and may not bisect either the first median line 312 or second median line 316. Other voids 236 may extend beyond the first median line 312 or second median line 316, in which case they void 236 exists entirely within the first layer 216 or the piezoelectric layer 220. Still other voids 236 may bisect a median line 312, 316 and, therefore, exist within at least two different layers of the substrate 204.

Figure 4A:
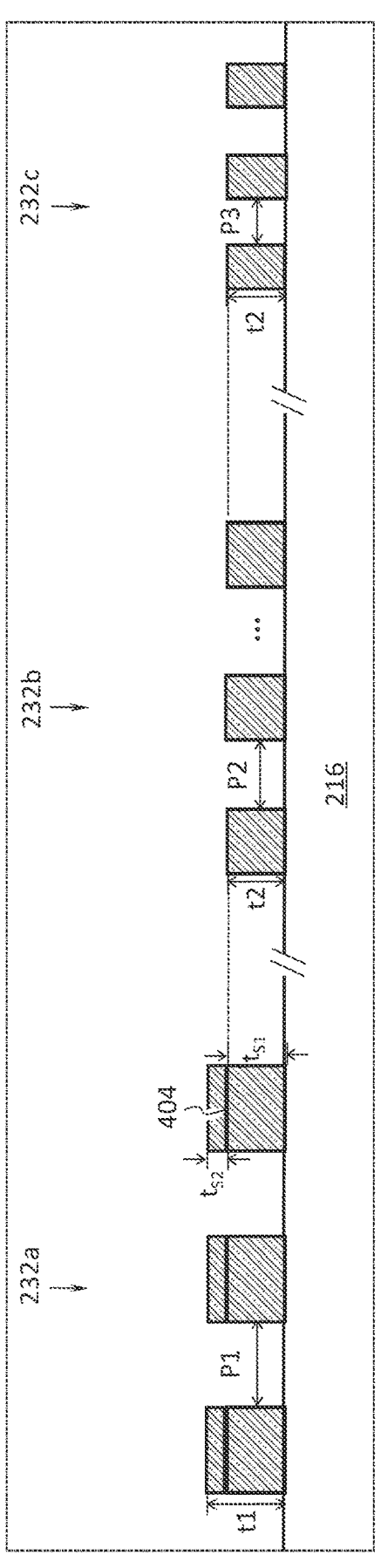
FIG. 4A is a detailed view illustrating details of area C' from FIG. 2A or FIG. 3A in accordance with at least some embodiments of the present disclosure.
Figure 4B:
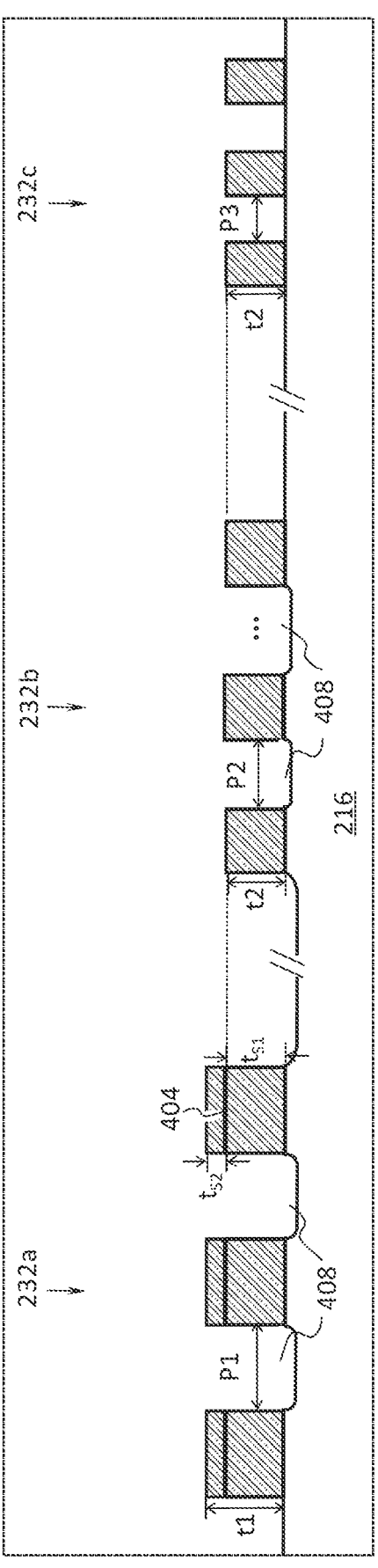
FIG. 4B is another detailed view illustrating further details of area C' from FIG. 2A or FIG. 3A in accordance with at least some embodiments of the present disclosure.
Figure 4C:
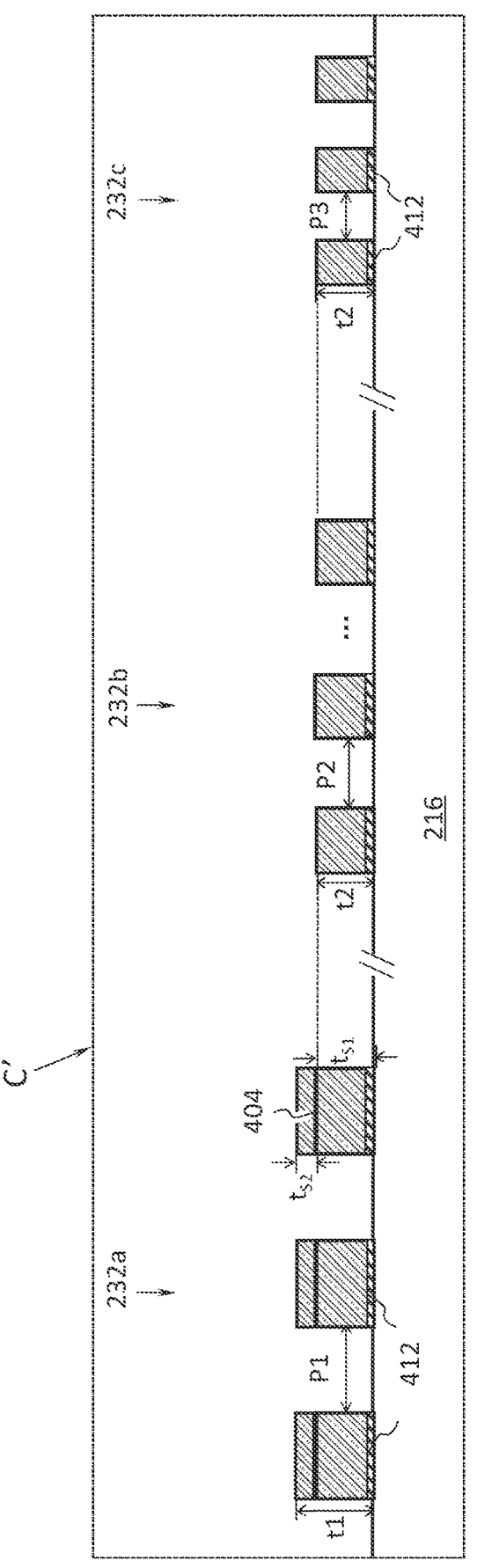
FIG. 4C is another detailed view illustrating further details of area C' from FIG. 2A or FIG. 3A in accordance with at least some embodiments of the present disclosure.

With reference now to FIGS. 4A thru 4C, additional details of section C' as shown in FIG. 2A and/or FIG. 3A will be described in accordance with at least some embodiments of the present disclosure. Referring first to FIG. 4A, the interdigitated metals 232a, 232b, 232c are shown to include material that is provided on the top surface 208 of the piezoelectric layer 216. The first interdigitated metal 232a may have a first thickness (t1) and may display a first gap width (P1). The second interdigitated metal 232b may have a second thickness (t2) and may display a second gap width (P2). The third interdigitated metal 232c may exhibit the same thickness as the second interdigitated metal 232c (e.g., the second thickness (t2)), but may display a third gap width (P3). In some embodiments, each of the gap widths (P1, P2, P3) are different from one another. In some embodiments, at least one gap width (e.g., the first gap width (P1)) is the same as at least one other gap width (e.g., the second gap width (P2)).

The first interdigitated metal 232a may also include a metal seam 404 that separates the first thickness (t1) into a first portion thickness (ts1) and a second portion thickness (ts2). The metal seam 404 may correspond to a physical seam or discontinuity of material in the first interdigitated metal 232a. The metal seam 404 may extend between and completely separate a first, lower, portion of the first interdigitated metal 232a and a second, upper, portion of the first interdigitated metal 232a. The metal seam 404 may be formed at a height that is substantially coplanar with the interdigitated metals 232b, 232c that are formed to the second thickness (t2). In some embodiments, the first thickness (t1) is greater than a thickness of all other interdigitated metals 232b, 232c. The first portion thickness (ts1), however, may be approximately equal to the second thickness (t2). This means that the second portion thickness (ts2) may correspond to a difference between the second thickness (t2) and the first thickness (t1). In some embodiments, the first thickness (t1) is greater than the second thickness (t2). In some embodiments, the first thickness (t1) may be at least 20% larger than the second thickness (t2). In some embodiments, the first thickness (t1) may be at least 50% larger than the second thickness (t2).

FIG. 4B illustrates that one or more of the gaps between interdigitated metals 232a, 232b, 232c may be provided with an undercut 408. The undercut 408 may be similar or identical to undercut 152 and may be provided between all interdigitated metals or just some of the interdigitated metals. In the depicted embodiment, the first interdigitated metal 232a and the second interdigitated metal 232b have an undercut 408 provided therebetween whereas the third interdigitated metal 232c does not have an undercut 408 provided therebetween. The undercut 408 as measured in the first direction from the top surface 208 to the top of the undercut 408 may be less than 15% of the first thickness (t1). In another embodiment, the undercut 408 is less than 10% of the second thickness (t2). It should be appreciated that the dimensions and shape of the undercut may depend upon the process used to form the undercut 408 and other components of the acoustic resonator device 100.

FIG. 4C illustrates that one, some, or all of the interdigitated metals 232a, 232b, 232c may be provided with an additional layer 412 at a bottom surface thereof. In some embodiments, the additional layer 412 may be provided as a thin deposit of material between the top surface 208 and the bottom surface of the interdigitated metals 232a, 232b, 232c. The additional layer 412 may comprise a thickness that is less than 50 Å and may be formed of any suitable material known to be used as an etch stop material or adhesion material. Suitable examples of materials that may be used to form the additional layer 412 include, without limitation, silicon nitride, silicon carbide, silicon carbonitride, and the like. Alternatively or additionally, the additional layer 412 may include any type of material that enables the additional layer 412 to act as an adhesion layer.

Figures 5A, 5B:
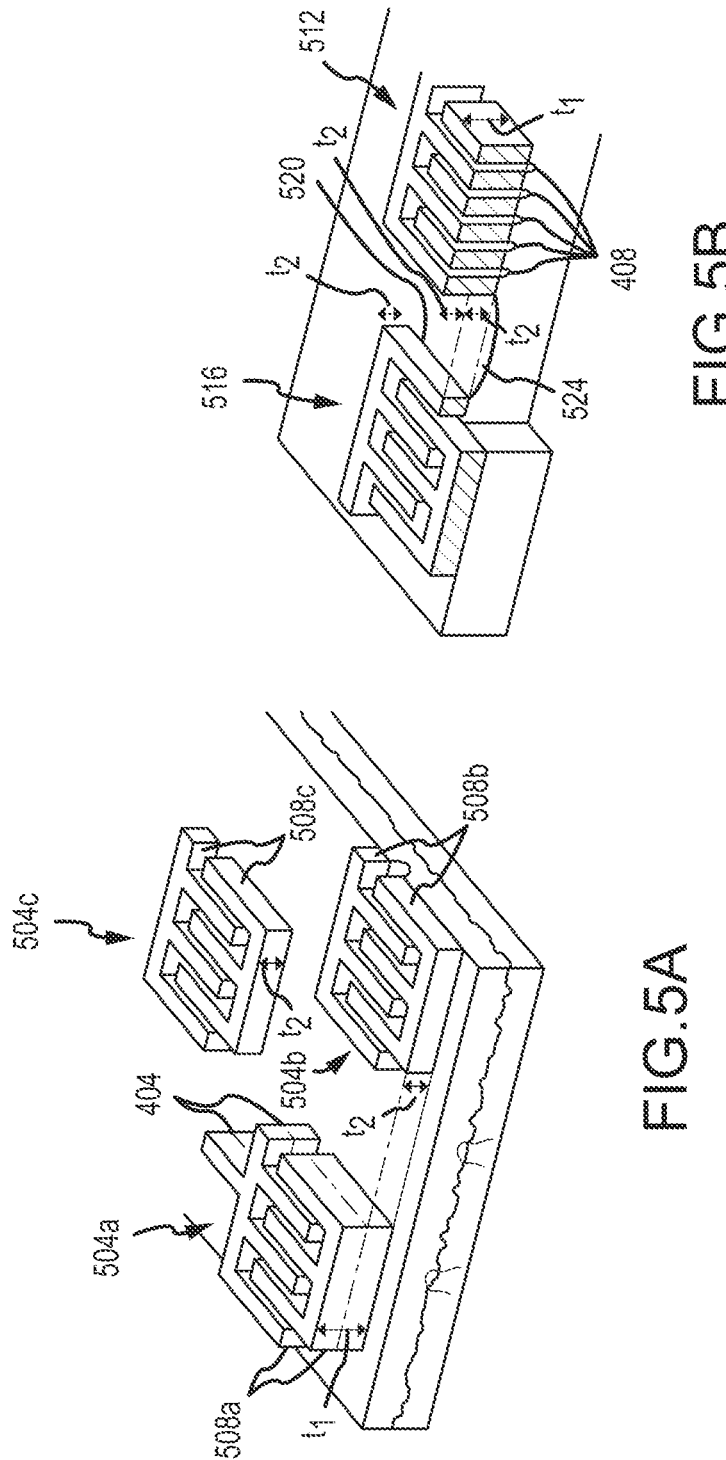
FIG. 5A is an isometric view of another acoustic resonator device in accordance with at least some embodiments of the present disclosure.
FIG. 5B is an isometric view of another acoustic resonator device in accordance with at least some embodiments of the present disclosure.

With reference now to FIGS. 5A and 5B, additional details of the interdigitated metals will be described in accordance with at least some embodiments of the present disclosure. FIG. 5A illustrates that the acoustic resonator device 100 may have a plurality of interdigitated metals organized as a set of interdigitated metals 508a, 508b, 508c. Each set of interdigitated metals 508a, 508b, 508c may operate as a different acoustic filter 504a, 504b, 504c, respectively. In some embodiments, each acoustic filter 504a, 504b, 504c may be configured to operate at different bandwidths even though each set of interdigitated metals 508a, 508b, 508c are provided in relatively close proximity to one another on a common substrate 204.

The embodiment of FIG. 5B further illustrates a configuration of the set of interdigitated metals 508a and 508b formed as a plurality of first fingers 512 and a plurality of second fingers 516. Each set of interdigitated metals may have a plurality of fingers alternately disposed between one another such that each set of interdigitated metals 508a, 508b, 508c has both a plurality of first fingers 512 and a plurality of second fingers 516. The plurality of first fingers 512 may have a first thickness (t1) whereas the plurality of second fingers 516 may have a second thickness (t2). In some embodiments, the plurality of first fingers 512 may correspond to the first interdigitated metal 232a whereas the plurality of second fingers 516 may correspond to the second interdigitated metal 232b.

The plurality of first fingers 512 may be separated from the plurality of second fingers 512 by a pitch 520. The pitch 520 may have a substantially flat portion or may have an additional recess or undercut 524 provided therebetween. The additional recess or undercut 524 may have a depth that is substantially similar to the depth of the undercut 408 even though the width of the pitch 520 may be substantially larger than the width between fingers in each interdigitated metal.

Figure 6A:
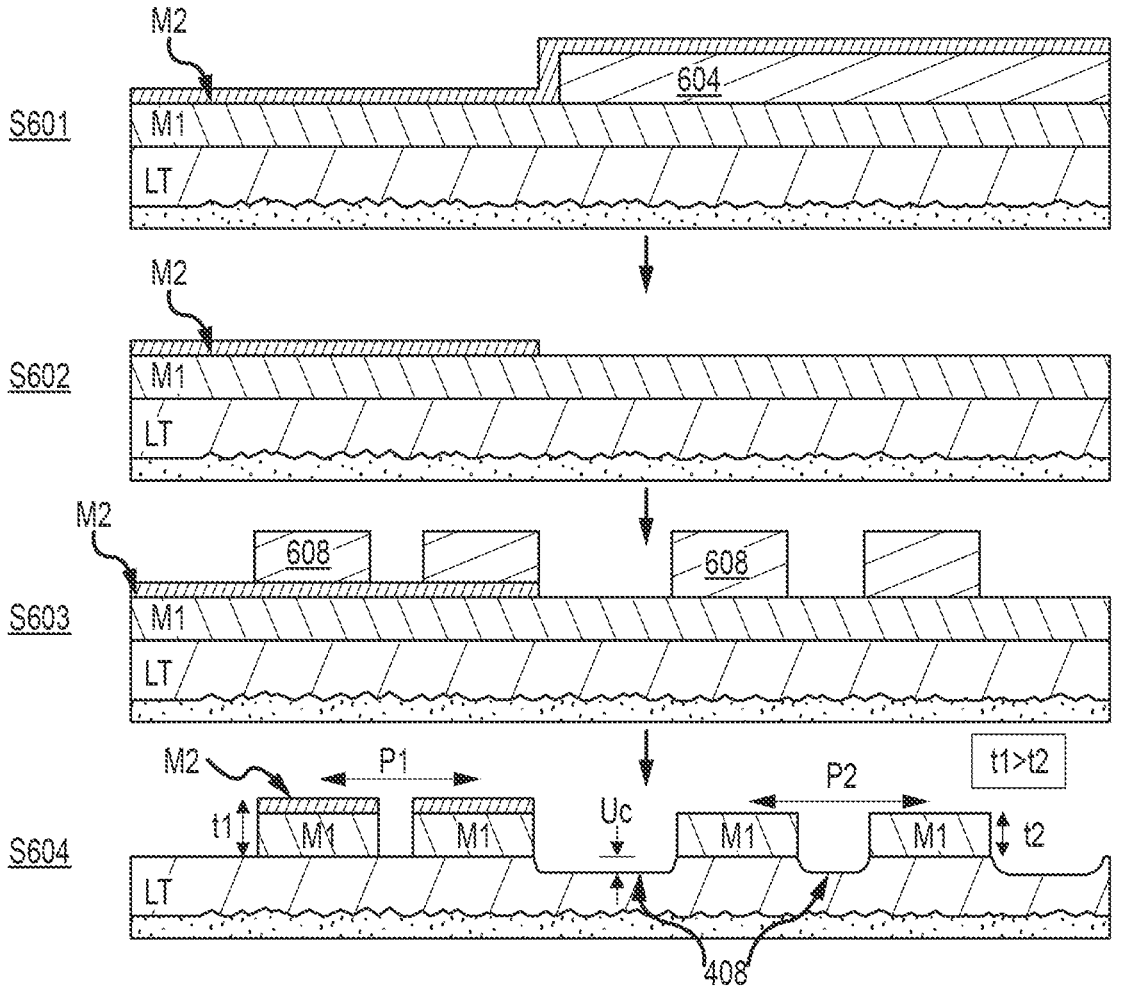
FIG. 6A illustrates a first possible method for producing an acoustic resonator device in accordance with at least some embodiments of the present disclosure.

With reference now to FIGS. 6A thru 6E, various methods of forming an acoustic resonator device 100 will be described in accordance with at least some embodiments of the present disclosure. FIG. 6A illustrates a first method where a first metal layer M1 and second metal layer M2 are deposited over the top surface 208 of the substrate 204 (step S601). Specifically, the metal layers M1, M2 may be deposited on the piezoelectric layer (LT), which may be the same as any of the other piezoelectric layers depicted and described herein. A mask layer 604 may also be deposited on top of the first metal layer M1.

The method may continue by removing a portion of the second metal layer M2 over the mask layer 604 (step S602). This removing step may be performed using any suitable lift-off technique or material removal step. At this point, the second metal layer M2 that was not overlapping the mask 604 is left behind and still overlaps the first metal layer M1.

The method may then continue by depositing and patterning another mask 608 to define a first and second set of electrodes (step S603). Thereafter, exposed portions of the metal layers M1, M2 may be removed using any type of suitable etch (step S604). This may create an undercut 408 between the first and second set of electrodes may remain and the depth of the undercut 408 may be represented as an undercut depth (Uc). Additionally, the first metal layer M1 is shown to have the second thickness (t2). The combined thickness of the first metal layer M1 and the second metal layer M2 is shown to have the first thickness (t1), which is shown to be larger than the second thickness (t2). It should be appreciated that the pitches (P1, P2) determine the frequency at which the interdigitated metals (and corresponding filters) operate. The smaller pitch also exhibits less undercut 408. This works in favor of not having to do more patterning.

Figure 6B:
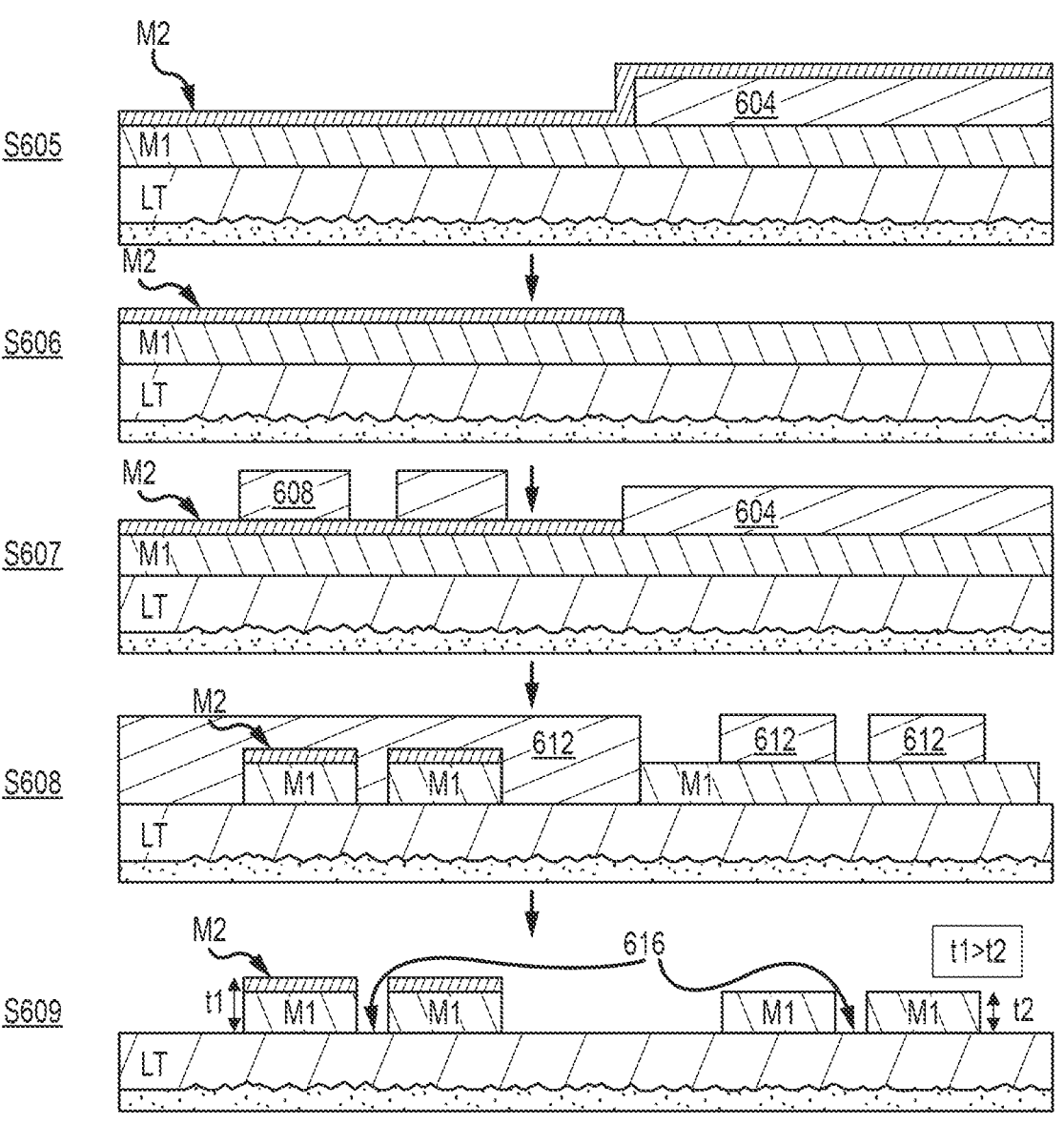
FIG. 6B illustrates a second possible method for producing an acoustic resonator device in accordance with at least some embodiments of the present disclosure.

Referring now to FIG. 6B, an alternative method of producing an acoustic resonator device 100 is depicted and will be described in accordance with at least some embodiments of the present disclosure. The method begins by depositing first and second metal layers M1, M2 and the mask layer 604 on the substrate 204 (step S605). This step is similar to step S601.

The method may then proceed by removing a portion of the second metal layer M2 over the mask layer 604 using a lift-off technique (step S606). This step is similar to step S602. Thereafter, additional masks 604, 608 are deposited and patterned to define a set of first electrodes (step S607). In this step, exposed portions of the first metal layer M1 and second metal layer M2 may be removed using a suitable etch. The mask 604 may also serve as a protective mask for later processing steps.

The method further proceeds by depositing and patterning yet another mask 612 to define a second set of electrodes (step S608). This mask 612 may also operate as a protective mask. The method may then proceed by removing exposed portions of the first metal layer M1 using a suitable etch (step S609). This may result in the creation of a planar or flat top piezoelectric surface 616.

Figure 6C:
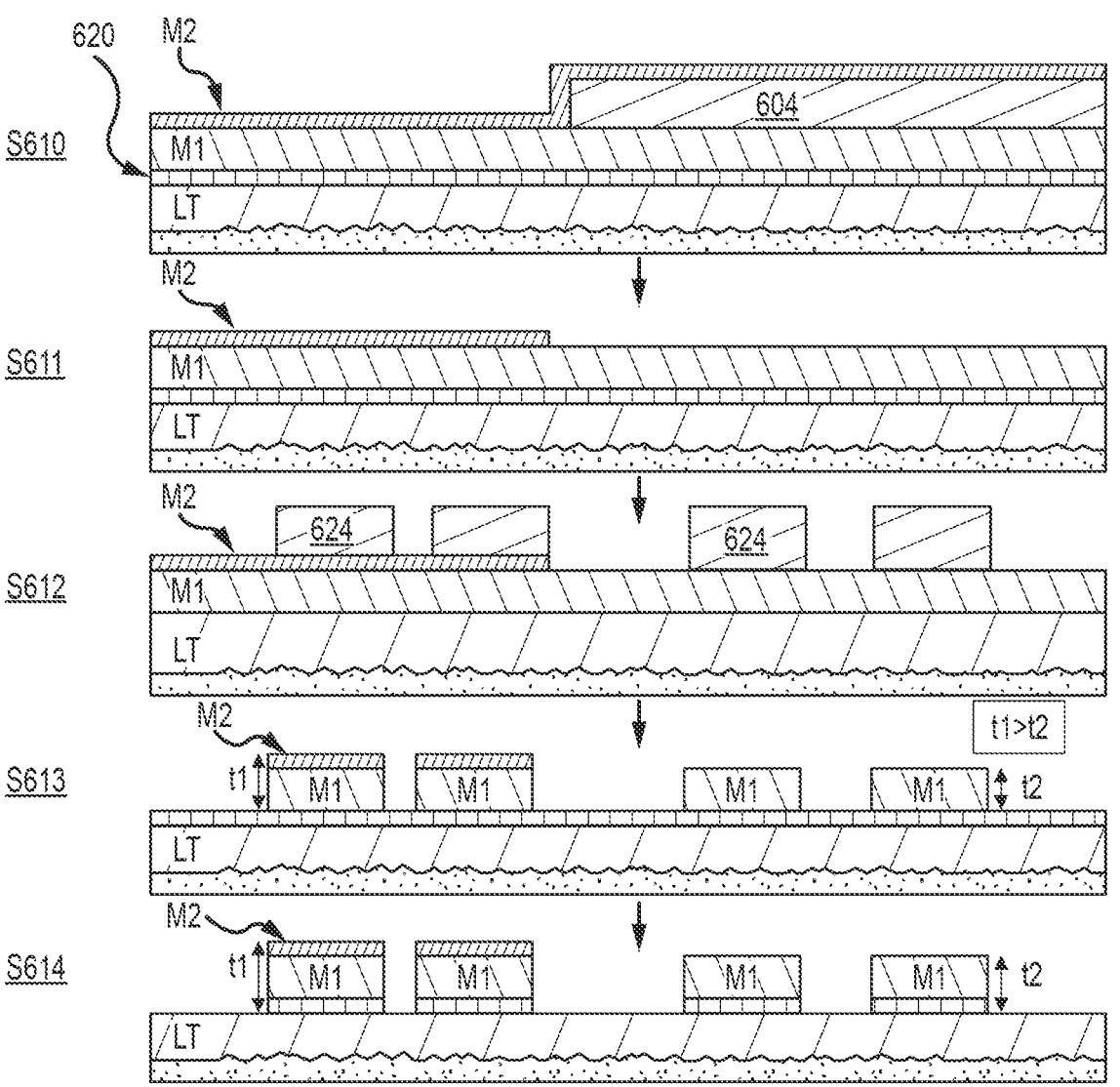
FIG. 6C illustrates a third possible method for producing an acoustic resonator device in accordance with at least some embodiments of the present disclosure.

Referring now to FIG. 6C, yet another method of producing an acoustic resonator device 100 will be described in accordance with at least some embodiments of the present disclosure. The method represents another proposed lift-off technique where an etch stop layer 620 is used in addition to a first metal layer M1, second metal layer M2, and mask 604. The method begins with the deposition of the first metal layer M1, second metal layer M2, and mask 604 on the etch stop layer 620 (step S610). In some embodiments, the etch stop layer 620 correspond to Si, SiO$_2$, SiC, or the like and may have a thickness of less than 50 Å.

The method continues by removing a portion of the second metal layer M2 that overlaps the mask 604 using any type of lift-off technique (step S611). Thereafter, an additional mask 624 is deposited and patterned to define a first and second set of electrodes (step S612). Exposed portions of the metal layers M1, M2 may then be removed using a suitable etch (step S613). Thereafter, exposed portions of the etch stop layer 620 may be removed revealing a planar top surface 616 (step S614). At this point, the remaining etch stop layer 620 only corresponds to the material of the etch stop layer 620 that is overlapped by the first metal layer M1 and/or second metal layer M2.

Figure 6D:
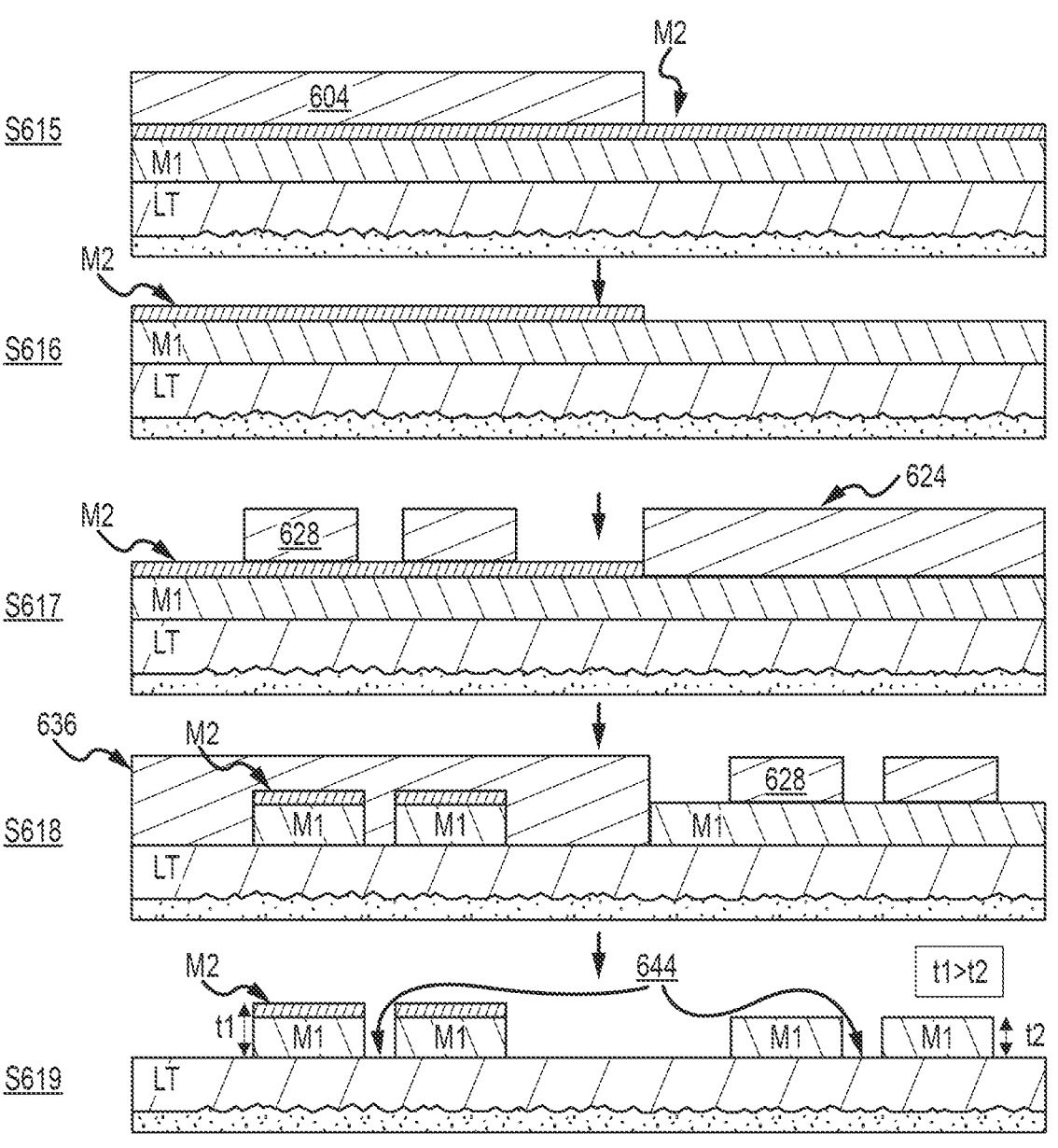
FIG. 6D illustrates a fourth possible method for producing an acoustic resonator device in accordance with at least some embodiments of the present disclosure.

Referring now to FIG. 6D, another method of producing an acoustic resonator device 100 will be described in accordance with at least some embodiments of the present disclosure. This method corresponds to another example of an etching technique used to produce a planar top surface 644, which may be similar to the planar or flat top piezoelectric surface 616. The method begins by depositing a first metal layer M1, second metal layer M2, and mask 604, but the mask 604 is deposited on top of the second metal layer M2 (step S615).

Thereafter, the method continues by removing exposed portions of the second metal layer M2 using a suitable etch (step S616). Then the method may proceed by depositing and patterning a mask 628 to define a first set of electrodes (step S617). In this step or thereafter, exposed portions of the first metal layer M1 and second metal layer M2 may be removed using a suitable etch. The method may then proceed by depositing and patterning a protective mask 636 and an additional mask 640 to define a second set of electrodes (step S618). The method may then proceed by removing exposed portions of the first metal layer M1 using a suitable etch (step S619). This etch process may result in the creation of the planar top surface 644.

Figure 6E:
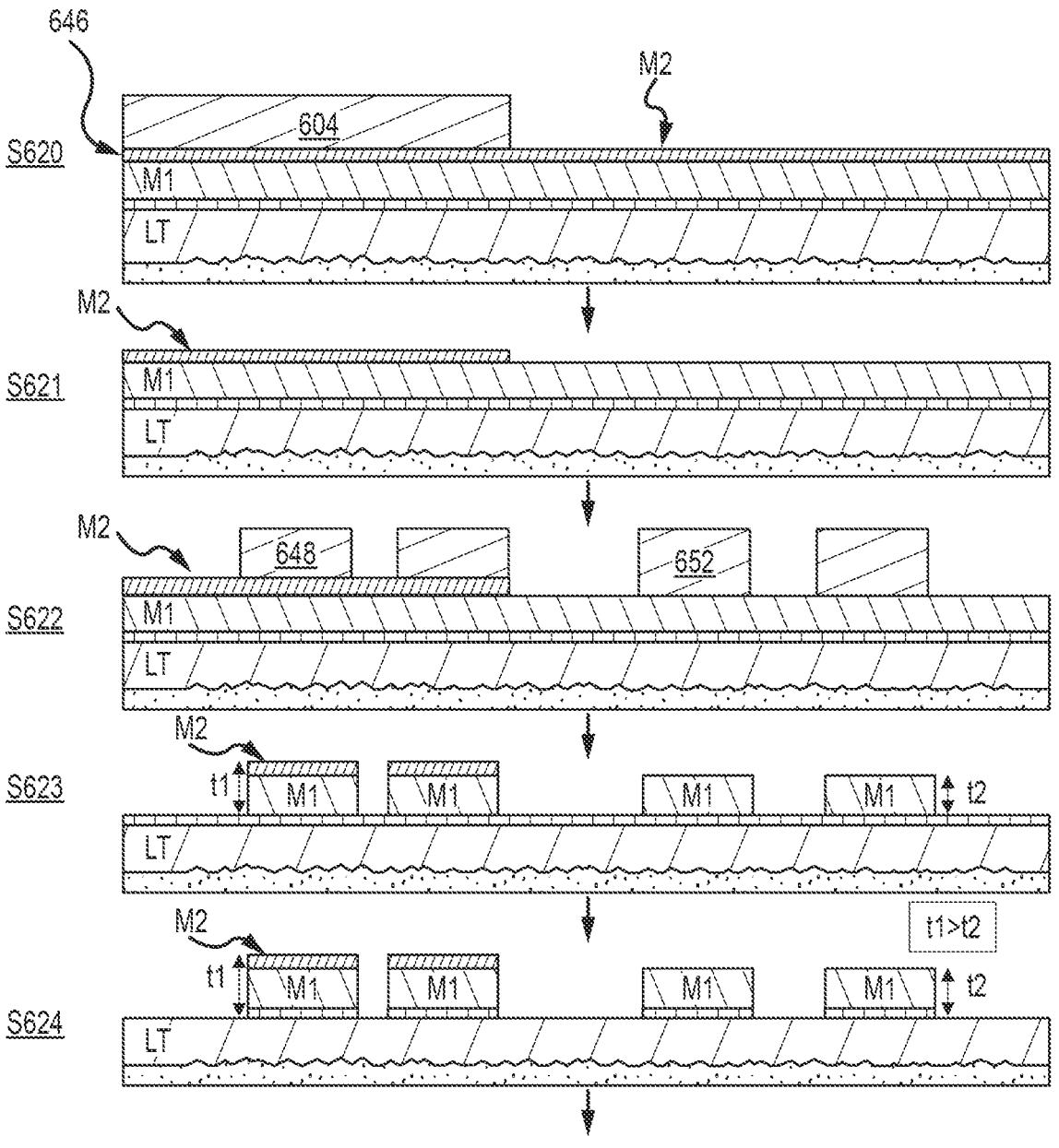
FIG. 6E illustrates a fifth possible method for producing an acoustic resonator device in accordance with at least some embodiments of the present disclosure.

With reference now to FIG. 6E, still another method of producing an acoustic resonator device 100 will be described in accordance with at least some embodiments of the present disclosure. The method begins by depositing a first metal layer M1, second metal layer M2, and mask 604 on top of the substrate 204, similar to step S615, but where the substrate 204 includes an etch stop layer 646 provided thereon (step S620).

The method may continue by removing exposed portions of the second metal layer M2 using a suitable etch (step S621). Thereafter, additional masks 648, 652 may be deposited and patterned to define a first and second set of electrodes (step S622). Thereafter, exposed portions of the metal layers M1, M2 may be removed using another suitable etch (step S623). The method may then continue by removing exposed portions of the etch stop layer 646, thereby creating a planar top surface 644 (step S624).

Figure 7:
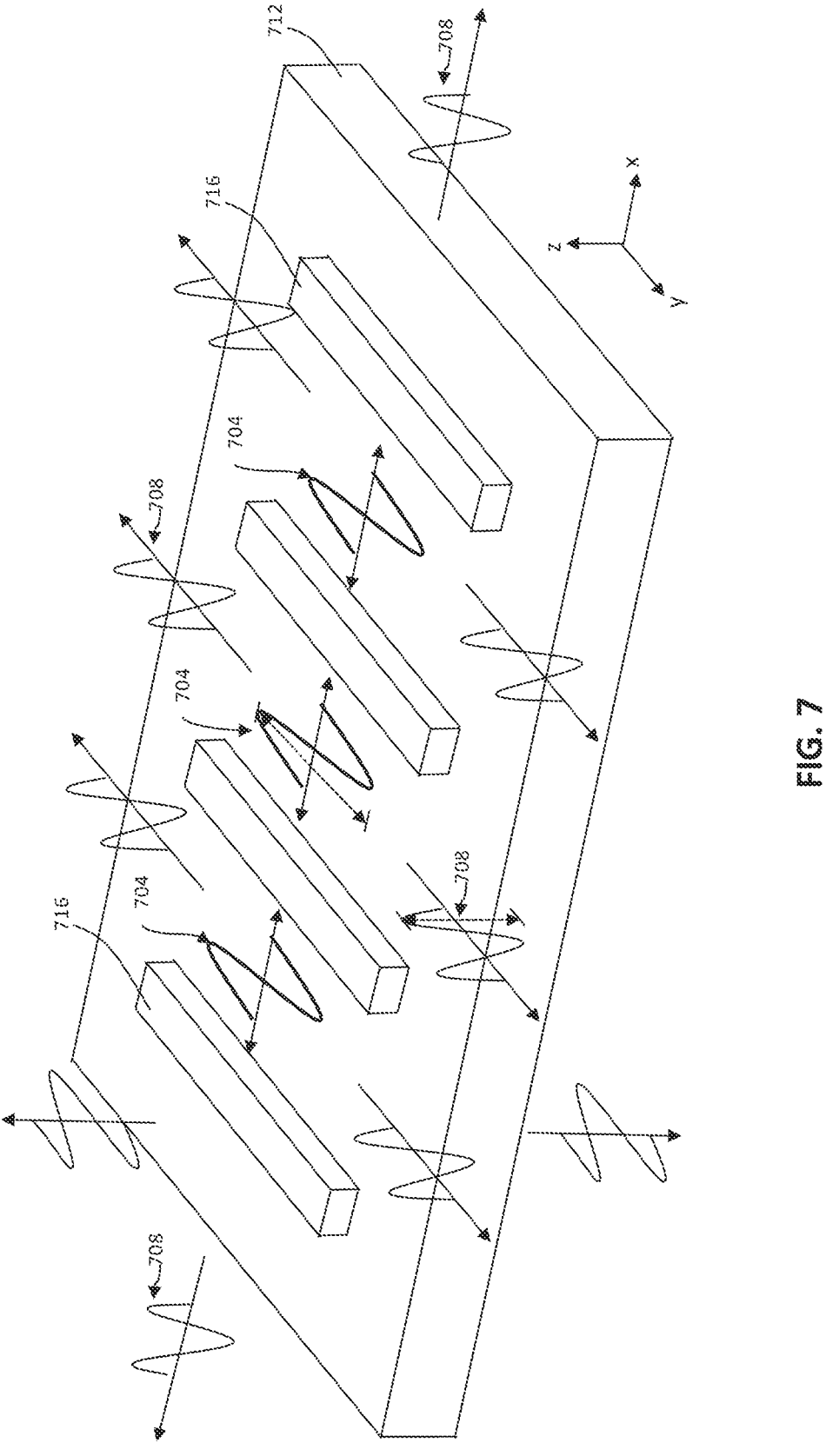
FIG. 7 is an isometric view of an acoustic resonator device illustrating various wave modes generated therein in accordance with at least some embodiments of the present disclosure.

With reference now to FIG. 7, various waves that may be present or produced in an acoustic resonator device 100 will be described in accordance with at least some embodiments of the present disclosure. The acoustic resonator device 100 depicted in FIG. 7 is shown to include a substrate 712 on which interdigitated metals 716 are deposited. The substrate 712 may be similar or identical to substrate 110 and/or substrate 204. Similarly, the interdigitated metals 716 may be similar or identical to interdigitated metals 130-1, 130-2, 130-*i* and/or interdigitated metals 232*a*, 232*b*, 232*c*. FIG. 7 also illustrates a three-dimensional axis, which can be correlated to various two-dimensional axes depicted and described herein. For instance, the z-axis shown in FIG. 7 may correspond to the first direction described above whereas the x-axis and y-axis shown in FIG. 7 may correspond to the second direction or a direction that is orthogonal to both the first direction and second direction depicted and described herein.

FIG. 7 also shows additional details of a shear mode acoustic wave 162, now depicted as a wave propagating in the x-direction with the x,y particle motion moving in the x-y plane. The shear mode acoustic wave 162 is shown to travel in the x-direction and is further shown to include a shear mode maximum amplitude displacement 704. The shear mode maximum amplitude displacement 704 may correspond to energy of the shear mode acoustic wave 162 that is positively used within the acoustic resonator device 100 (e.g., to provide filter capabilities).

The bulk mode acoustic wave 164, however, is also shown to propagate in the substrate 712 and is less desirous within the acoustic resonator device 100. The bulk mode acoustic wave 164 is shown to travel in the z-direction and is further shown to include a bulk mode maximum amplitude displacement 708. The bulk mode maximum amplitude displacement 708 may correspond to energy of the bulk mode acoustic wave 164 that creates spurious modes or other unwanted conditions within the substrate 712. The various acoustic wave scattering structures 120 are provided in the substrate 712 to minimize or destroy the bulk mode acoustic wave 164 and the bulk mode maximum amplitude displacement 708 carried therewith.

Figure 8:
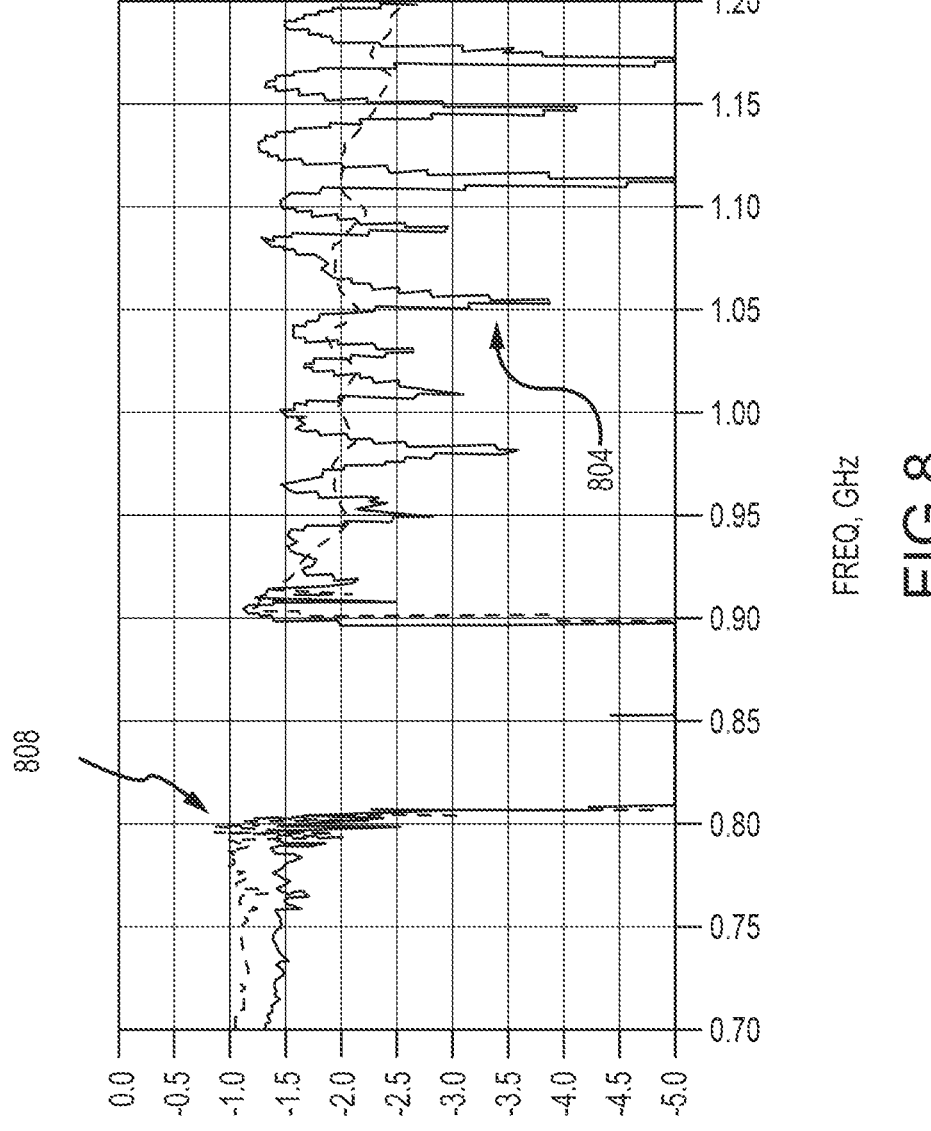
FIG. 8 is a diagram illustrating spurious modes of an acoustic resonator device with and without acoustic wave scattering structures.
Figure 9:
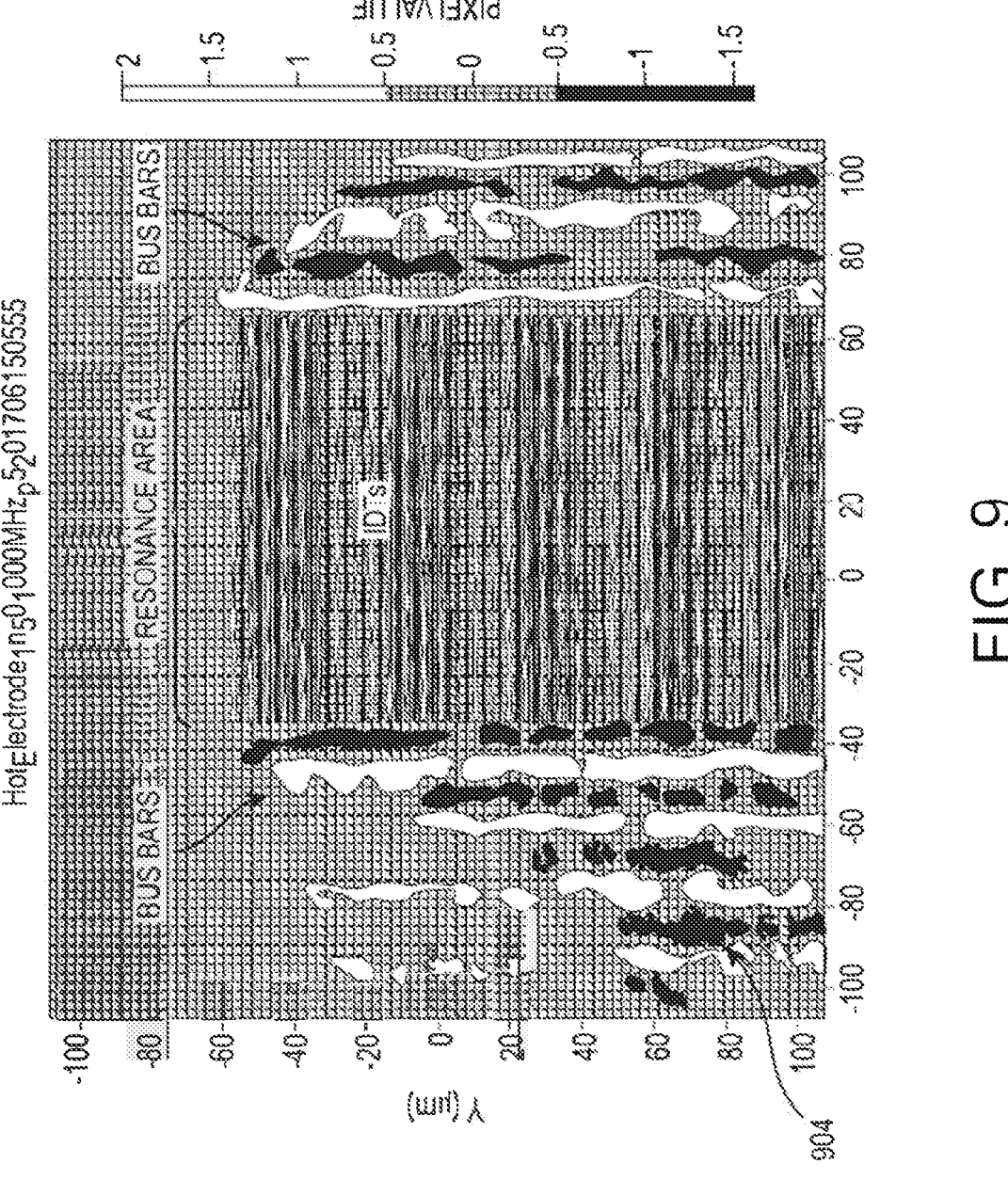
FIG. 9 is a diagram illustrating energy propagation in an acoustic resonator device in accordance with at least some embodiments of the present disclosure.

With reference now to FIGS. 8 and 9 additional details regarding the impact of an acoustic resonator device 100 produced with and without an acoustic wave scattering structure 120 will be described in accordance with at least some embodiments of the present disclosure. FIG. 8 illustrates a first waveform 804 showing spurious modes at multiple frequencies of an acoustic resonator device 100 produced without an acoustic wave scattering structure 120. This first waveform 804 illustrate undesired spurious modes due, at least in part, to the propagation of and failure to mitigate or destroy the coherent bulk mode waves. On the other hand, a second waveform 808 is also illustrated showing the performance of an acoustic resonator device 100 having one or more acoustic wave scattering structures 120. The acoustic wave scattering structures 120 help enable coherent bulk mode prevention and further reduce or eliminate the spurious modes.

The first and second waveforms 804, 808 may be captured using any type of suitable measurement method. Non limiting examples of such measurement methods are described in further detail in the following, each of which are hereby incorporated herein by reference in their entirety: Telschow et al., "Full-field Imaging of Gigahertz Bulk Acoustic Resonator Motion," IEEE Trans. Ultrasonics, Ferroelectrics, & Freq. Control, 50, 1279-1285 (2003); Kokkonen, "Laser Interferometers in Physical Acoustics," 2009 IEEE International Ultrasonics Symposium Proceedings, pp. 1036-1043 (2009); and Lipiainen, "Optical imaging of surface dynamics in microstructures", Ph.D. dissertation, 201/2016, Alto University, Finland (December 2016).

FIG. 9 illustrates how energy can be seen propagating away from the interdigitated metals (e.g., within the acoustic track). It can also be seen in FIG. 9 how standing waves are formed in the bus bar electrodes 904 on both sides of the interdigitated metals. It should be appreciated that the highest amplitude displacement of the bulk mode is outside the acoustically active region due to the coherent bulk mode. But, these interference structures (e.g., element 804 in FIGS. 8 and 904 in FIG. 9) are not easily observed when implementing the acoustic wave scattering structure 120 as disclosed herein.

Apodized surfaces have been described herein and the roughness of such surfaces has been generally depicted and/or described in relation to a two-dimensional representation of the apodized surface. It should be appreciated that a roughness value can either be calculated or determined based on a profile (e.g., line) or on a surface (e.g., area). The profile roughness parameter along a line is a more common way of representing roughness, but area roughness parameters should also be considered within the scope of the present disclosure. Many roughness parameters can be determined based on a mean line system, but this is not a requirement of the present disclosure. Rather, it is intended that roughness, as discussed and claimed herein, can refer to a roughness measurement in either two or three dimensions.

A number of different acoustic resonator devices have been depicted and described herein. Aspects of the present disclosure contemplate an acoustic resonator device having: a carrier layer, a first layer disposed over the carrier layer, and a piezoelectric layer disposed over the first layer. The acoustic resonator device is further disclosed to include an interdigitated metal disposed over the piezoelectric layer, wherein the interdigitated metal is configured to generate acoustic waves within an acoustically active region and an acoustic wave scattering structure disposed within the substrate.

Additional aspects of the present disclosure contemplate that the acoustic wave scattering structure includes an apodized surface a plurality of voids proximate to the apodized surface where at least one of the plurality of voids is in direct contact with the apodized surface.

Additional aspects of the present disclosure contemplate at least one of the plurality of voids is distanced away from the apodized surface and at least one of the plurality of voids comprises a void width that is less than 5% of a thickness of the first layer.

Additional aspects of the present disclosure contemplate the apodized surface is disposed between the first layer and the piezoelectric layer and wherein at least one of the plurality of voids is disposed within the piezoelectric layer.

Additional aspects of the present disclosure contemplate the apodized surface is disposed between the first layer and the piezoelectric layer and wherein at least one of the plurality of voids is disposed within the first layer.

Additional aspects of the present disclosure contemplate the apodized surface is disposed between the first layer and the piezoelectric layer and wherein at least one of the plurality of voids is partially disposed within the first layer and partially disposed within the piezoelectric layer.

Additional aspects of the present disclosure contemplate the acoustic resonator device to further include a plurality of substrate seams.

Additional aspects of the present disclosure contemplate at least one of the plurality of substrate seams are in direct contact with at least one of the plurality of voids.

Additional aspects of the present disclosure contemplate at least one of the plurality of voids is located at an end of one of the plurality of substrate seams.

Additional aspects of the present disclosure contemplate a first portion of a first substrate seam in the plurality of substrate seams extends substantially perpendicular to a surface of the carrier layer.

Additional aspects of the present disclosure contemplate a second portion of the first substrate seam extends substantially perpendicular to the first portion of the first substrate seam.

Additional aspects of the present disclosure contemplate the first substrate seam forms a U-shaped substrate seam structure.

Additional aspects of the present disclosure contemplate at least one of the plurality of substrate seams partially extends into the first layer.

Additional aspects of the present disclosure contemplate at least one of the plurality of substrate seams extends across the first layer.

Additional aspects of the present disclosure contemplate that the acoustic resonator device further includes a second layer disposed between the piezoelectric layer and the first layer, wherein at least one of the plurality of substrate seams extends across the first layer and at least partially into the second layer.

Additional aspects of the preset disclosure contemplate that the acoustic resonator device further includes a second layer disposed between the piezoelectric layer and the first layer, wherein at least one of the plurality of substrate seams extends across the first layer and across the second layer.

Additional aspects of the present disclosure contemplate the carrier layer is substantially devoid of the plurality of substrate seams.

Additional aspects of the present disclosure contemplate an acoustic resonator device that includes a substrate having: a carrier layer; a first layer disposed over the carrier layer; and a piezoelectric layer disposed over the first layer. The acoustic resonator device further includes an interdigitated metal disposed over the piezoelectric layer of the substrate defining therein an acoustic track, where the interdigitated metal is configured to generate acoustic waves, wherein the acoustic waves comprise a lateral component having a first wave amplitude displacement substantially on a horizontal plane that is substantially parallel with the substrate, and where the acoustic waves further comprise a non-lateral component launched into the piezoelectric layer having a second wave amplitude displacement that is outside of the horizontal plane; and an acoustic wave scattering structure provided within the substrate that is distanced away from but sufficiently close to the interdigitated metal so as to scatter the non-lateral component of the acoustic waves.

Additional aspects of the present disclosure contemplate the lateral component of the acoustic wave comprises a shear mode acoustic wave trapped under the acoustic track, wherein the acoustic wave scattering structure is configured to scatter the acoustic waves so as to prevent the acoustic waves from becoming coherent outside of the acoustic track, wherein the acoustic wave scattering structure comprises at least one of an apodized surface, a plurality of voids, and a plurality of substrate seams, wherein the interdigitated metal and the acoustic track are portions of a first filter device disposed on the substrate, and wherein the acoustic resonator device further includes: a second filter device comprising an additional interdigitated metal located adjacent to an additional acoustic track, wherein the acoustic wave scattering structure is configured to scatter the acoustic waves such that the non-lateral component is inhibited from acoustically interfering with the second filter device.

Additional aspects of the present disclosure contemplate an acoustic resonator device that includes a substrate having: a carrier layer; a first layer disposed over the carrier layer, and a piezoelectric layer disposed over the first layer. The acoustic resonator device is further disclosed to include an interdigitated metal disposed over the piezoelectric layer, where the interdigitated metal is configured to generate acoustic waves within an acoustically active region for filtering purposes and a plurality of acoustic wave scattering structures provided in the substrate and configured to scatter a selected directional component of the acoustic waves.

Additional aspects of the present disclosure contemplate an acoustic resonator device that includes a substrate having: a carrier layer, a first layer disposed over the carrier layer, and a piezoelectric layer disposed over the first layer. The acoustic resonator device may further include an interdigitated metal disposed over the piezoelectric layer, where the interdigitated metal is configured to generate acoustic waves within an acoustically active region for filtering purposes and an apodized surface disposed within the substrate. Additionally, the first layer may have a first layer thickness (tFL) measured in a first direction that is substantially perpendicular relative to the carrier layer, the apodized surface may have a maximum height roughness profile (Rti) within a predetermined sampling length (Lp) measured along the first direction, and the maximum height roughness profile (Rti) within the predetermined sampling length (Lp) is approximately more than 0.1% of the first layer thickness (tFL).

Additional aspects of the present disclosure contemplate that the maximum height roughness profile (Rti) within the predetermined sampling length (Lp) is approximately more than 1% of the first layer thickness (tFL).

Additional aspects of the present disclosure contemplate that the predetermined sampling length (Lp) is approximately between 5 μm and 500 μm.

Additional aspects of the present disclosure contemplate an acoustic resonator device that includes a substrate having: a carrier layer, a first layer disposed over the carrier layer, and a piezoelectric layer disposed over the first layer. The acoustic resonator device may further include an interdigitated metal disposed over the piezoelectric layer, where the interdigitated metal is configured to generate acoustic waves within an acoustically active region for filtering purposes. The acoustic resonator device may further include an apodized surface disposed within the substrate, where: the apodized surface is at a first distance (D) measured from a top surface of the substrate in a first direction that is substantially perpendicular relative to the carrier layer; the apodized surface has a maximum height roughness profile (Rti) within a predetermined sampling length (Lp) measured along the first direction; and the maximum height roughness profile (Rti) within the predetermined sampling length (Lp) is approximately more than 0.01% of the first distance (D).

Additional aspects of the present disclosure contemplate an acoustic resonator device that includes a substrate; two or more acoustic filters having at least a first filter device corresponding to a first bandwidth and a second filter device corresponding to a second bandwidth that is distinguishable from the first bandwidth such that the first filter device and the second filter device are operable in two different communication channels; and each of the two or more acoustic filters comprises an interdigitated metal, where the interdigitated metal has one of a first thickness (t1) and a second thickness (t2), and where the second thickness (t2) is different from the first thickness (t1) measuring perpendicularly from the substrate.

Additional aspects of the present disclosure contemplate that the first thickness (t1) is greater than the second thickness (t2).

Additional aspects of the present disclosure contemplate that the first thickness (t1) is about 1.5 times the second thickness (t2).

Additional aspects of the present disclosure contemplate that: the interdigitated metal of the first filter device has the first thickness (t1); the interdigitated metal of the second filter device has the second thickness (t2); and the first thickness (t1) is greater than the second thickness (t2).

Additional aspects of the present disclosure contemplate that the interdigitated metal of the first filter device includes a metal seam that includes a separation line of two metal materials and the metal seam is formed at a height substantially corresponding to the second thickness (t2).

Additional aspects of the present disclosure contemplate that the metal seam includes a separation line of two different metal materials.

Additional aspects of the present disclosure contemplate that the metal seam is defined by a different tone of the interdigitated metal.

Additional aspects of the present disclosure contemplate that the metal seam includes a separation line caused by two different metallic bondings of the interdigitated metal.

Additional aspects of the present disclosure contemplate that the interdigitated metal includes a first sublayer and a second sublayer separated by the metal seam.

Additional aspects of the present disclosure contemplate that the first sublayer includes predominantly a first metallic material, the second sublayer includes predominantly a second metallic material, and the first metallic material is the same as the second metallic material.

Additional aspects of the present disclosure contemplate that the first sublayer includes predominantly a first metallic material, the second sublayer includes predominantly a second metallic material, and the first metallic material is different from the second metallic material.

Additional aspects of the present disclosure contemplate that the first sublayer includes a first grain size and the second sublayer includes a second grain size that is different than the first grain size.

Additional aspects of the present disclosure contemplate that the first sublayer includes a first sublayer thickness and the second sublayer includes a second sublayer thickness that is different than the first sublayer thickness.

Additional aspects of the present disclosure contemplate that the first sublayer thickness is greater than the second sublayer thickness.

Additional aspects of the present disclosure contemplate that the second sublayer thickness is less than 50% of the first sub-layer thickness.

Additional aspects of the present disclosure contemplate that the first thickness (t1) is thicker than the second thickness (t2) by approximately the second sublayer thickness.

Additional aspects of the present disclosure contemplate that the second thickness (t2) and the first sublayer thickness are substantially similar.

Additional aspects of the present disclosure contemplate that the interdigitated metal of the first filter device includes a first pitch separating a plurality of first fingers of the interdigitated metal; the interdigitated metal of the second filter device includes a second pitch separating a plurality of second fingers of the interdigitated metal; and the first pitch is different from the second pitch.

Additional aspects of the present disclosure contemplate that the substrate includes at least one of an apodized surface, a plurality of voids, and a plurality of seams.

Additional aspects of the present disclosure contemplate that each of the interdigitated metals of the two or more acoustic filters is disposed over a top planar portion of the substrate.

Additional aspects of the present disclosure contemplate that at least one of the interdigitated metals of the two or more acoustic filters is disposed a first top portion of the substrate, and the first top portion of the substrate includes at least an undercut adjacent to a finger of the at least one of the interdigitated metals of the two or more acoustic filters.

Additional aspects of the present disclosure contemplate that the undercut is less than 15% of the first thickness (t1).

Additional aspects of the present disclosure contemplate that the undercut is less than 10% of the second thickness (t2).

Additional aspects of the present disclosure contemplate that the acoustic resonator device may further include an undercut that is disposed between the interdigitated metal of the first filter device, and the interdigitated metal of the second filter device.

Additional aspects of the present disclosure contemplate that the acoustic resonator device may further include an undercut, disposed between a plurality of fingers of the interdigitated metal of the second filter device.

Additional aspects of the present disclosure contemplate that each of the interdigitated metals of the two or more acoustic filters is disposed over an etch stop layer.

Additional aspects of the present disclosure contemplate that the etch stop layer is disposed in between a top surface of the substrate and a bottom surface of the interdigitated metals of the two or more acoustic filters.

Additional aspects of the present disclosure contemplate that the etch stop layer includes a thickness that is less than 50 Å.

Additional aspects of the present disclosure contemplate that the two or more acoustic filters comprise a third acoustic filter corresponding to a third bandwidth that is distinguishable from the first bandwidth and the second bandwidth.

Additional aspects of the present disclosure contemplate that the acoustic resonator device further includes a filter circuit disposed on the substrate.

Additional aspects of the present disclosure contemplate that the filter circuit includes at least one of an inductor, a capacitor, and a resistor.

Additional aspects of the present disclosure contemplate an acoustic resonator device including: a substrate; and a first set of interdigitated metals and a second set of interdigitated metals disposed on the substrate, where each of the first set of interdigitated metals includes a metal seam that is formed at a height that is approximately equal to a height of the second set of interdigitated metals.

Additional aspects of the present disclosure contemplate that: the first set of interdigitated metals includes a first thickness (t1) measured substantially orthogonal to the substrate; the second set of interdigitated metals includes a second thickness (t2) measured substantially orthogonal to the substrate; and the second thickness (t2) is less than the first thickness (t1).

Additional aspects of the present disclosure contemplate that the metal seam separates the first thickness (t1) into a first sublayer thickness and a second sublayer thickness, and the first sublayer thickness is substantially equal to the second thickness (t2).

Additional aspects of the present disclosure contemplate that the acoustic resonator device further includes three or more acoustic filters, where each of the three or more acoustic filters includes one of the first set and the second set of interdigitated metals.

Additional aspects of the present disclosure contemplate an acoustic resonator device that includes: a substrate; a first filter device having a plurality of first fingers disposed on a first portion of the substrate that is substantially planar; and a second filter device having a plurality of second fingers disposed on a second portion of the substrate that comprises at least a recess, where the recess is disposed adjacent to one of the first fingers and one of the second fingers.

Additional aspects of the present disclosure contemplate that the recess is disposed in between one of the first fingers and one of the second fingers.

Additional aspects of the present disclosure contemplate that the acoustic resonator device may further include an additional recess, where the additional recess is disposed between the plurality of first fingers and the plurality of second fingers.

Additional aspects of the present disclosure contemplate that: the plurality of first fingers include a first thickness (t1) measured orthogonal to the substrate; the plurality of second fingers include a second thickness (t2) measured orthogonal to the substrate; and the first thickness (t1) and the second thickness (t2) are different from each other.

Additional aspects of the present disclosure contemplate an acoustic resonator device that includes: a substrate; a first filter device corresponding to a first bandwidth, where the first filter device includes a first set of metal layers having a first thickness (t1) measuring perpendicularly from the substrate and a metal seam; a second filter device corresponding to a second bandwidth that is distinguishable from the first bandwidth, where the second filter device includes a second set of metal layers having a second thickness (t2) that is different from the first thickness (t1); and an acoustic wave scattering structure disposed within the substrate, where the acoustic wave scattering structure is configured to incoherently scatter acoustic waves that are launched into a bulk region of a piezoelectric layer of the substrate, and thereby acoustically isolates the first filter device from the second filter device on the same substrate.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A device, comprising:
a substrate;
a first filter device disposed over the substrate, wherein the first filter device comprises a first interdigitated metal, wherein the first interdigitated metal comprises a first thickness extending in a direction perpendicular to a surface of the substrate;
a second filter device disposed over the substrate, wherein the second filter device comprises a second interdigitated metal, wherein the second interdigitated metal comprises a second thickness extending in the same direction as the first thickness, wherein the first thickness is greater than the second thickness; and
a wave scattering structure disposed over in the substrate, wherein the wave scattering structure comprises:
at least one apodized surface associated with a height roughness parameter;
at least one void located within a distance of the at least one apodized surface that is less than the height roughness parameter and associated with a first width that is less than the first thickness; and
at least one substrate seam associated with a second width that is less than the first thickness.

2. The device of claim 1, wherein the first interdigitated metal of the first filter device comprises
a first sublayer;
a second sublayer disposed over the first sublayer; and
a metal seam separating the first sublayer and the second sublayer.

3. The device of claim 2, wherein the first sublayer comprises a first metallic material and the second sublayer comprises a second metallic material same as the first metallic material.

4. The device of claim 2, wherein the first sublayer comprises a first metallic material and the second sublayer comprises a second metallic material different than the first metallic material.

5. The device of claim 2, wherein the first sublayer comprises a first grain size and the second sublayer comprises a second grain size different than the first grain size.

6. The device of claim 2, wherein the metal seam includes a separation line caused by a first metallic bondings of the first interdigitated metal differing from a second metallic bondings of the second interdigitated metal.

7. The device of claim 2, wherein the first sublayer comprises a first sublayer thickness extending in the same direction as the first thickness and the second sublayer comprises a second sublayer thickness extending in the same direction as the first thickness, wherein the second sublayer thickness different from the first sublayer thickness.

8. The device of claim 7, wherein the second sublayer thickness is less than 50% of the first sublayer thickness.

9. The device of claim 8, wherein the second sublayer thickness is less than 15% of the first sublayer thickness.

10. The device of claim 7, wherein the second thickness is substantially similar to the first sublayer thickness.

11. The device of claim 1, wherein the first interdigitated metals comprises a first pitch separating a plurality of first fingers of the first interdigitated metal, wherein the second interdigitated metals comprises a second pitch separating a plurality of second fingers of the second interdigitated metal, and wherein the first pitch is different from the second pitch.

12. The device of claim 1, wherein each of the first interdigitated metal and the second interdigitated metal is configured to generate acoustic waves within an acoustically active region.

* * * * *